United States Patent
Feng et al.

(10) Patent No.: US 11,227,549 B2
(45) Date of Patent: Jan. 18, 2022

(54) SHIFT REGISTER UNIT, DRIVING METHOD THEREOF, GATE DRIVER AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 157 days.

(21) Appl. No.: 16/623,653

(22) PCT Filed: May 23, 2019

(86) PCT No.: PCT/CN2019/088144
§ 371 (c)(1),
(2) Date: Dec. 17, 2019

(87) PCT Pub. No.: WO2020/042685
PCT Pub. Date: Mar. 5, 2020

(65) Prior Publication Data
US 2021/0335266 A1    Oct. 28, 2021

(30) Foreign Application Priority Data
Aug. 30, 2018   (CN) .................. CN201811003294

(51) Int. Cl.
*G09G 3/3266*   (2016.01)
*G11C 19/28*    (2006.01)

(52) U.S. Cl.
CPC ........... *G09G 3/3266* (2013.01); *G11C 19/28* (2013.01); *G09G 2310/0286* (2013.01); *G09G 2310/061* (2013.01)

(58) Field of Classification Search
CPC ......... G09G 3/3266; G09G 2310/0286; G09G 2310/061; G11C 19/28
See application file for complete search history.

(56) References Cited

U.S. PATENT DOCUMENTS 9,472,303 B2   10/2016  Ma
9,722,086 B2 *  8/2017  Shionoiri ........... H03K 19/0016
(Continued)

FOREIGN PATENT DOCUMENTS

CN   101976580 A    2/2011
CN   103413514 A   11/2013
(Continued)

OTHER PUBLICATIONS

First Office Action for Chinese Application No. 201811003294.8, dated Sep. 4, 2019, 9 Pages.
(Continued)

*Primary Examiner* — Alexander Eisen
*Assistant Examiner* — Nathaniel P Brittingham
(74) *Attorney, Agent, or Firm* — Brooks Kushman P.C.

(57) ABSTRACT

A shift register unit, a driving method thereof, a gate driver and a display device are provided. The shift register unit includes a first input circuit, an output circuit and a charging enhancement circuit. The first input circuit is configured to charge a first node in response to a first input signal; the output circuit is configured to output, under control of a level of the first node, a shift signal for a row-by-row shift of scanning and a first output signal for driving one row of sub-pixel units in a display panel to perform display scanning; and the charging enhancement circuit is configured to
(Continued)

further enhance the level, of the first node in response to a charging enhancement signal. The shift register unit may enhance the level of the first node and the reliability of the gate driver and the display device consisted of the shift register unit.

17 Claims, 12 Drawing Sheets

(56) References Cited

U.S. PATENT DOCUMENTS

| | | | |
|---|---|---|---|
| 2010/0007653 A1* | 1/2010 | Ahn | G09G 3/3677 345/214 |
| 2010/0164854 A1 | 7/2010 | Kim et al. | |
| 2016/0064098 A1 | 3/2016 | Han et al. | |
| 2016/0232866 A1 | 8/2016 | Cho et al. | |
| 2017/0193947 A1 | 7/2017 | Kim et al. | |
| 2017/0213515 A1 | 7/2017 | Chen et al. | |
| 2019/0012973 A1 | 1/2019 | Wang | |
| 2019/0096500 A1 | 3/2019 | Gu et al. | |

FOREIGN PATENT DOCUMENTS

| | | |
|---|---|---|
| CN | 105632565 A | 6/2016 |
| CN | 105869556 A | 8/2016 |
| CN | 106814911 A | 6/2017 |
| CN | 106875913 A | 6/2017 |
| CN | 107068106 A | 8/2017 |
| CN | 107578741 A | 1/2018 |
| CN | 108806597 A | 11/2018 |
| JP | H0227598 A | 1/1990 |
| KR | 1020080008800 A | 1/2008 |
| KR | 1020170078978 A | 7/2017 |

OTHER PUBLICATIONS

International Search Report and Written Opinion for Application No. PCT/CN2019/088144, dated Aug. 21, 2019, 12 Pages.
First Office Action for Indian Application No. 201927052682, dated Jul. 30, 2021, 6 Pages (including translation).

* cited by examiner

SHIFT REGISTER UNIT, DRIVING METHOD THEREOF, GATE DRIVER AND DISPLAY DEVICE

CROSS-REFERENCE TO RELATED APPLICATIONS

This application is the U.S. national phase of PCT Application No. PCT/CN2019/088144 filed on May 23, 2019, which claims priority to Chinese Patent Application No. 201811003294.8 filed on Aug. 30, 2018, which are incorporated herein by reference in their entireties.

TECHNICAL FIELD

The present disclosure relates to a shift register unit, a driving method thereof, a gate driver and a display device.

BACKGROUND

In a display field, especially in an Organic Light-Emitting Diode (OLED) display panel, a gate driver is generally integrated in a gate Integrated Circuit (IC). In an IC design, a chip area is a main factor affecting a chip cost. How to effectively reduce the chip area is a key consideration for technical developers.

SUMMARY

At least one embodiment of the present disclosure provides a shift register unit, includes a first input circuit, an output circuit and a charging enhancement circuit. The first input circuit is configured to charge a first node in response to a first input signal; the output circuit is configured to output, under control of a level of the first node, a shift signal for a row-by-row shift of scanning and a first output signal for driving one row of sub-pixel units in a display panel to perform display scanning; and the charging enhancement circuit is configured to further enhance the level of the first node in response to a charging enhancement signal.

For example, the shift register unit of the embodiment of the present disclosure further includes a selecting control circuit and a second input circuit. The selecting control circuit is configured to charge a second node in response to a selecting control signal and maintain a level of the second node; and the second input circuit is configured to charge the first node under control of the level of the second node.

For example, in the shift register unit of the embodiment of the present disclosure, the selecting control circuit is connected with the second node, and the selecting control circuit is configured to receive a second input signal and charge the second node by using the second input signal when the selecting control circuit is turned on.

For example, in the shift register unit of the embodiment of the present disclosure, the second input circuit is connected with the first node and the second node, and the second input circuit is configured to receive a first clock signal and charge the first node by using the first clock signal when the second input circuit is turned on.

For example, in the shift register unit of the embodiment of the present disclosure, the charging enhancement circuit is connected with the first node, and the charging enhancement circuit is configured to receive a second clock signal as the charging enhancement signal, and further enhance the level of the first node by using the second clock signal when the charging enhancement circuit is turned on.

For example, in the shift register unit of the embodiment of the present disclosure, the charging enhancement circuit includes a first transistor and a first capacitor. A gate of the first transistor is connected with the first node, a first electrode of the first transistor is configured to receive the second clock signal, a second electrode of the first transistor is connected with a first electrode of the first capacitor, and a second electrode of the first capacitor is connected with the first node.

For example, the shift register unit of the embodiment of the present disclosure further includes a reset transistor, wherein a gate of the reset transistor is connected with a third node, a first electrode of the reset transistor is connected with the first electrode of the first capacitor, and a second electrode of the reset transistor is configured to receive a first voltage, such that the first capacitor is reset by the first voltage.

For example, in the shift register unit of the embodiment of the present disclosure, the selecting control circuit includes a second transistor and a second capacitor. A gate of the second transistor is configured to receive the selecting control signal, a first electrode of the second transistor is configured to receive the second input signal, a second electrode of the second transistor is connected with the second node; and a first electrode of the second capacitor is connected with the second node, and a second electrode of the second capacitor is configured to receive a first voltage.

For example, in the shift register unit of the embodiment of the present disclosure, the second input circuit includes a third transistor and a fourth transistor. A gate of the third transistor is connected with the second node, a first electrode of the third transistor is configured to receive the first clock signal, a second electrode of the third transistor is connected with a first electrode of the fourth transistor; and a gate of the fourth transistor is configured to receive the first clock signal, and a second electrode of the fourth transistor is connected with the first node.

For example, in the shift register unit of the embodiment of the present disclosure, the first input circuit includes a fifth transistor. A gate of the fifth transistor is configured to receive the first input signal, a first electrode of the fifth transistor is configured to receive a second voltage, and a second electrode of the fifth transistor is connected with the first node.

For example, in the shift register unit of the embodiment of the present disclosure, the output circuit includes a shift signal output sub-circuit, the shift signal output sub-circuit includes a sixth transistor and a shift signal output terminal. The shift signal output terminal is configured to output the shift signal; a gate of the sixth transistor is connected with the first node, a first electrode of the sixth transistor is configured to receive the third clock signal as the shift signal, and a second electrode of the sixth transistor is connected with the shift signal output terminal.

For example, in the shift register unit of the embodiment of the present disclosure, the charging enhancement circuit includes a seventh capacitor; a first electrode of the seventh capacitor is connected with the first node, a second electrode of the seventh capacitor is connected with a terminal of the output circuit which outputs the shift signal.

For example, in the shift register unit of the embodiment of the present disclosure, the shift signal output terminal is further configured to output the first output signal, and the third clock signal received by the first electrode of the sixth transistor is used as the first output signal.

For example, in the shift register unit of the embodiment of the present disclosure, the output circuit further includes a first output sub-circuit, the first output sub-circuit includes a seventh transistor, a third capacitor and a first output signal terminal. The first output signal terminal is configured to output the first output signal; a gate of the seventh transistor is connected with the first node, a first electrode of the seventh transistor is configured to receive a fourth clock signal as the first output signal, and a second electrode of the seventh transistor is connected with the first output signal terminal; and a first electrode of the third capacitor is connected with the first node, and a second electrode of the third capacitor is connected with the first output signal terminal.

For example, in the shift register unit of the embodiment of the present disclosure, the output circuit further includes a second output sub-circuit, the second output sub-circuit includes a seventeenth transistor, a fourth capacitor and a second output signal terminal; the second output signal terminal is configured to output the second output signal; a gate of the seventeenth transistor is connected with the first node, a first electrode of the seventeenth transistor is configured to receive a fifth clock signal, and a second electrode of the seventeenth transistor is connected with the second output signal terminal; and a first electrode of the fourth capacitor is connected with the first node, and a second electrode of the fourth capacitor is connected with the second output signal terminal.

For example, in the shift register unit of the embodiment of the present disclosure, the output circuit further includes a third output sub-circuit and a fourth output sub-circuit, the third output sub-circuit includes a nineteenth transistor, a fifth capacitor and a third output signal terminal; the third output signal terminal is configured to output the third output signal; a gate of the nineteenth transistor is connected with the first node, a first electrode of the nineteenth transistor is configured to receive a sixth clock signal, and a second electrode of the nineteenth transistor is connected with the third output signal terminal; a first electrode of the fifth capacitor is connected with the first node, and a second electrode of the fifth capacitor is connected with the third output signal terminal; and the fourth output sub-circuit includes a twenty-first transistor, a sixth capacitor and a fourth output signal terminal; the fourth output signal terminal is configured to output the fourth output signal; a gate of the twenty-first transistor is connected with the first node, a first electrode of the twenty-first transistor is configured to receive a seventh clock signal, and a second electrode of the twenty-first transistor is connected with the fourth output signal terminal; a first electrode of the sixth capacitor is connected with the first node, and a second electrode of the sixth capacitor is connected with the fourth output signal terminal.

For example, the shift register unit in one embodiment of the present disclosure further includes a node control circuit and a first reset circuit. The output circuit includes a shift signal output terminal and a first output signal terminal, the shift signal output terminal is configured to output the shift signal, the first output signal terminal is configured to output the first output signal, the node control circuit is configured to control a level of a third node under control of the level of the first node, and the first reset circuit is configured to reset the first node, the shift signal output terminal, the first output signal terminal and the charging enhancement circuit under control of the level of the third node.

For example, the shift register unit in one embodiment of the present disclosure further includes a second reset circuit and a third reset circuit. The second reset circuit is configured to reset the first node in response to a display reset signal, and the third reset circuit is configured to reset the first node in response to a global reset signal.

For example, in the shift register unit in one embodiment of the present disclosure, the output circuit further includes a second output signal terminal configured to output a second output signal; the first reset circuit is further configured to reset the second output signal terminal under control of the level of the third node.

For example, in the shift register unit in one embodiment of the present disclosure, the output circuit further includes a third output signal terminal and a fourth output signal terminal. The third output signal terminal is configured to output a third output signal, and the fourth output signal terminal is configured to output a fourth output signal; the first reset circuit is further configured to reset the third output signal terminal and the fourth output signal terminal under control of the level of the third node.

At least one embodiment of the present disclosure further provides a gate driver including a plurality of the shift register units in the embodiments of the present disclosure connected in cascade.

For example, the gate driver in one embodiment of the present disclosure further includes a first sub-clock signal line and a second sub-clock signal line. Each stage of the shift register units is connected with the first sub-clock signal line to receive a selecting control signal; each stage of the shift register units is connected with the second sub-clock signal line to receive a first clock signal; a $(n+2)^{th}$ stage of the shift register units is connected with a $n^{th}$ stage of the shift register units to receive a shift signal output by the $n^{th}$ stage of the shift register units as a first input signal of the $(n+2)^{th}$ stage of the shift register units; the $n^{th}$ stage of the shift register units is connected with a $(n+3)^{th}$ stage of the shift register units to receive the shift signal output by the $(n+3)^{th}$ stage of the shift register units as a display reset signal of the $n^{th}$ stage of the shift register units; the shift signal output by each stage of the shift register units is adopted as a second input signal of the current stage of the shift register units; n is an integer larger than zero.

At least one embodiment of the present disclosure further provides a display device including the gate driver in the embodiments of the present disclosure.

For example, the display device in one embodiment of the present disclosure further includes a plurality of sub-pixel units arranged in array. When the shift register unit outputs the first output signal and a second output signal, the first output signal and the second output signal are respectively provided to sub-pixel units in different rows.

At least one embodiment of the present disclosure further provides a method for driving the shift register unit including: charging, by the first input circuit, the first node in response to the first input signal; enhancing, by the charging enhancement circuit, the level of the first node in response to the charging enhancement signal; and outputting, by the output circuit, the shift signal and the first output signal under control of the level of the first node.

For example, in the method of the embodiment of the present disclosure, a rising edge of the charging enhancement signal precedes a rising edge of the first output signal; and/or a falling edge of the charging enhancement signal follows a falling edge of the first output signal.

BRIEF DESCRIPTION OF THE DRAWINGS

In order to illustrate the technical solutions of the present disclosure in a clearer manner, the drawings desired for the present disclosure will be described hereinafter briefly.

Obviously, the following drawings merely relate to some embodiments of the present disclosure, but a protection scope of the present disclosure is not limited thereto.

DETAILED DESCRIPTION

Figure 1:
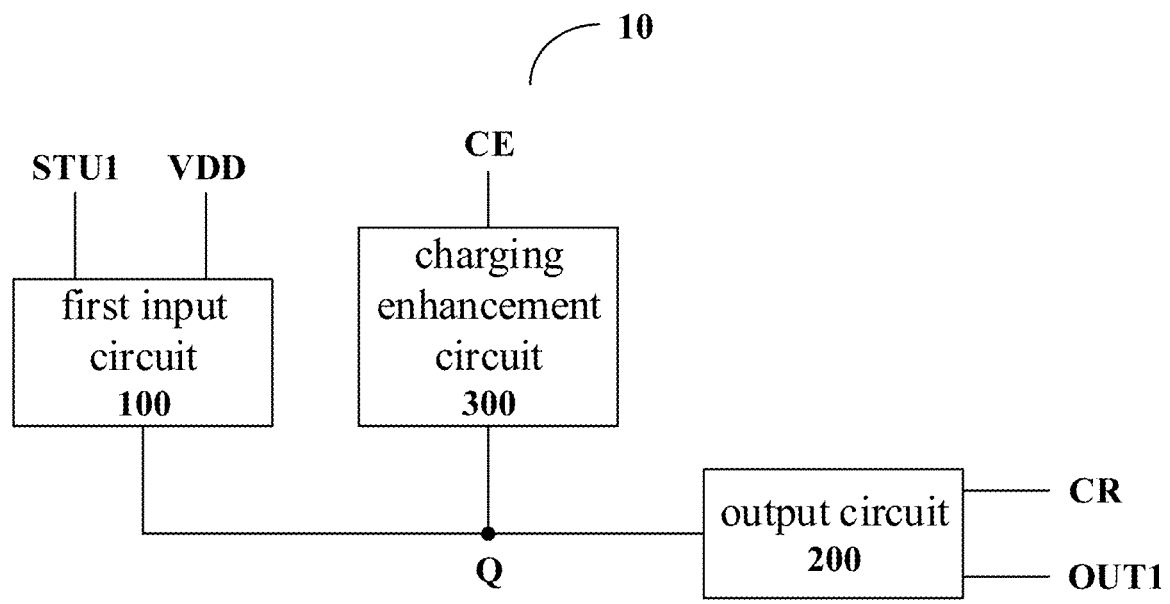
FIG. 1 is a schematic diagram illustrating a shift register unit according to one embodiment of the present disclosure.

In order to make an objective, a technical solution and an advantage of the present disclosure clearer, the technical solutions in the embodiments of the present disclosure will be described hereinafter clearly and completely with reference to the drawings of the embodiments of the present disclosure. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless defined otherwise, technical or scientific terms in the embodiments of the present disclosure shall be of general meanings understood by those skilled in the art. Terms "first", "second" and similar terms in the embodiments of the present disclosure embodiments do not indicate any order, quantity or importance, but are used only for distinguishing different components. Similarly, terms "one", "a" or "the" do not mean quantitative restrictions, but rather an existence of at least one. Terms "include", "comprise" or similar terms indicate that components or objects listed before the term cover components, objects or other equivalents thereof listed after the term, without excluding other components or objects. Term "connect" or other similar terms are not limited to physical or mechanical connections, but may include direct or indirect electrical connections. "Up", "down", "left", "right" and so on are only to represent a relative position relationship. When an absolute position of an object is changed, the relative position relationship may also be changed accordingly.

In the embodiments of the present disclosure, for example, when each circuit is implemented by N-type transistors, the term "pull-up" means charging a node or an electrode of a transistor so as to increase an absolute level of the node or the electrode, thereby realizing a corresponding operation of the transistor (e.g., turning on); and the term "pull-down" means discharging a node or an electrode of a transistor so as to reduce an absolute level of the node or the electrode, thereby realizing a corresponding operation of the transistor (e.g., turning off).

For example, when each circuit is implemented using P-type transistors, the term "pull-up" means discharging a node or an electrode of a transistor so as to reduce an absolute level of the node or the electrode, thereby realizing a corresponding operation of the transistor (e.g., turning on); and the term "pull-down" means charging a node or an electrode of a transistor so as to increase an absolute level of the node or the electrode, thereby realizing a corresponding operation of the transistor (e.g., turning off).

Moreover, specific meanings of the terms "pull-up" and "pull-down" may also be adjusted according to specific types of the adopted transistors, as long as controls of the transistors may be realized to achieve corresponding switching functions.

At present, a gate driver in OLED usually consists of three sub-circuits, i.e. a detecting circuit, a display circuit and a connecting circuit (or a gate circuit) outputting composite pulses of the detecting circuit and the connecting circuit. Such circuit structure is very complex and cannot meet requirements of a narrow frame and a high resolution.

For compensating a sub-pixel unit in an OLED display panel, besides setting a pixel compensation circuit in the sub-pixel unit for an internal compensation, an external compensation may be performed by providing a sensing transistor. When the external compensation is performed, a gate driver consisted of the shift register units needs to provide driving signals for a scanning transistor and the sensing transistor to the sub-pixel unit in the display panel, for example, a scanning driving signal for the scanning transistor is provided in a display period of a frame, and a sensing driving signal for the sensing transistor is provided in a blanking period of the frame.

In an external compensation method, the sensing driving signal output by the gate driver is sequentially scanned row by row. For example, the sensing driving signal for a first row of the sub-pixel units in the display panel is output in the blanking period of a first frame, and the sensing driving signal for a second row of the sub-pixel units in the display panel is output in the blanking period of a second frame, and so on. The sensing driving signal is output in a row-by-row order and at a frequency that the sensing driving signal corresponding to a row of the sub-pixel units is output in each frame, i.e., the compensation of the display panel is completed in the row-by-row order.

However, when the above-mentioned sequential compensation method is used, the following problems may be caused: first, there is a scanning line moving row by row in a process of scanning and displaying multi-frame images; second, due to a difference of time points for the external compensation, a brightness difference between different areas in the display panel may be large, for example, when performing the external compensation on a $100^{th}$ row of the sub-pixel units in the display panel, the external compensation on a $10^{th}$ row of the sub-pixel units in the display panel is already performed, but brightness of the $10^{th}$ row of the sub-pixel units in the display panel may be changed at this time, for example, the brightness of the $10^{th}$ row of the sub-pixel unit is decreased, which may cause uneven brightness of the different areas in the display panel. And this problem is more obvious in a large-size display panel.

In addition, for example, in a shift register unit, since there may be a threshold voltage drift in the transistor, charging the first node is insufficient, and output of the shift register unit may be abnormal. For example, the shift register unit does not output the driving signal, or a level of the output driving signal is relatively low.

To solve the above problems, at least one embodiment of the present disclosure provides a shift register unit. The shift register unit includes a first input circuit, an output circuit and a charging enhancement circuit. The first input circuit is configured to charge a first node in response to a first input signal; the output circuit is configured to output a shift signal and a first output signal under control of a level of the first node; and the charging enhancement circuit is configured to further enhance the level of the first node in response to a charging enhancement signal. The embodiments of the present disclosure further provide a gate driver corresponding to the shift register unit described above, a driving method thereof and a display device.

The shift register unit, the driving method thereof, the gate driver and the display device in the embodiments of the present disclosure may enhance the level of the first node and improve reliability of the circuit. Furthermore, a random compensation may also be realized while the row-by-row sequential compensation is accomplished (for example the row-by-row sequential compensation is required in the shut-down detection, which may avoid poor display problems such as the scanning line and the uneven display brightness caused by the row-by-row sequential compensation.

It should be appreciated that, in the embodiments of the present disclosure, the random compensation refers to an external compensation method different from the row-by-row sequential compensation. The random compensation may randomly output the sensing driving signal corresponding to any row of the sub-pixel units in the display panel in the blanking period of one frame. The any row of the sub-pixel units is randomly selected, which is the same with that in the following embodiments, and a description thereof will not be repeated herein.

In addition, in the embodiments of the present disclosure, for illustrative purposes, "a frame", "each frame" or "one frame" is defined to include the display period and the blanking period performed in sequence. For example, in the display period, the gate driver outputs the driving signal that may drive the display panel to complete a scanning display of a complete image from a first row to a last row (i.e., to perform a scanning display of one frame). In the blanking period, the gate driver outputs the driving signal that may drive the sensing transistor in one row of the sub-pixel units of the display panel to extract electrical parameters (e.g. extracting the threshold voltage of the transistor), for example, and then perform the external compensation of the row of the sub-pixel units according to the electrical parameters.

Embodiments and examples of the present disclosure will be described in detail below with reference to the accompanying drawings.

At least one embodiment of the present disclosure provides a shift register unit 10, as shown in FIG. 1, the shift register unit 10 includes a first input circuit 100, an output circuit 200 and a charging enhancement circuit 300. A plurality of shift register units 10 are connected in cascades to form the gate driver 20 of one embodiment of the present disclosure for driving a display operation of the display panel, thereby allowing the display panel to display one frame of image through the row-by-row scanning, for example, and perform the external compensation operation.

The first input circuit 100 is configured to charge a first node Q in response to a first input signal STU1.

For example, as shown in FIG. 1, the first input circuit 100 is connected with the first node Q. In some embodiments, the first input circuit 100 is configured to receive the first input signal STU1 and a second voltage VDD. When the first input circuit 100 is turned on under control of the first input signal STU1, the second voltage VDD may be used for charging the first node Q to pull up the level of the first node Q. For example, in another embodiments, the first input circuit 100 may not receive the second voltage VDD, and the first input signal STU1 is used for charging the first node Q to pull up the level of the first node Q when the first input circuit 100 is turned on.

For example, when the plurality of the shift register units 10 are connected in cascades to form the gate driver, besides the first several stages (e.g. a first stage, a second stage, etc.) of the shift register units, the first input circuit 100 in the other stages of the shift register units 10 may be connected with an adjacent (e.g., the second stage before the current stage) shift register unit 10 to receive a shift signal, so that the shift signal may be used as the first input signal STU1 of the current stage of the shift register units. The first several stages (e.g. the first stage, the second stage, etc.) of the shift register units may be connected with individual signal line to receive the first input signal STU1.

It should be appreciated that, in the embodiments of the present disclosure, the second voltage VDD is, for example, a high level, which is the same as that in following embodiments and will not be repeated.

In addition, it should be appreciated that, in the embodiments of the present disclosure, the high level and a low level are relative concepts. The high level represents a higher voltage range (for example, the high level may be 5V, 10V or other suitable voltage), and multiple high levels may be the same or different. Similarly, the low level represents a lower voltage range (for example, the low level may be 0V, −5V, −10V or other suitable voltage), and multiple low levels may be the same or different. For example, a minimum value of the high level is larger than a maximum value of the low level.

The output circuit 200 is configured to output a shift signal CR and a first output signal OUT1 under control of the level of the first node Q. For example, the output circuit 200 may be configured to receive a third clock signal CLKC and a fourth clock signal CLKD. When the output circuit 200 is turned on under control of the level of the first node Q, the third clock signal CLKC may be output as the shift signal CR, and the fourth clock signal CLKD may be output as the first output signal OUT1.

For example, in a display period of one frame, the shift signal CR output by the output circuit 200 may be provided to other shift register units 10 as the first input signal STU1, thus completing the row-by-row shift of display scanning;

the first output signal OUT1 output by the output circuit 200 may drive the sub-pixel units of one row in the display panel to perform the display scanning. For example, in the blanking period of one frame, the first output signal OUT1 output by the output circuit 200 may be used for driving a sensing transistor in one row of the sub-pixel units of the display panel to complete the external compensation of the row of the sub-pixel units.

The charging enhancement circuit 300 is configured to further enhance the level of the first node Q in response to a charging enhancement signal CE. It should be appreciated that, in the embodiments of the present disclosure, "enhancing the level of the first node Q" means further increasing or reducing the level of the first node Q on the basis of an original level of the first node Q. For example, when the first node Q is at a high level, "enhancing the level of the first node Q" means pulling up the level of the first node Q to further increase the level of the first node Q; for example, when the first node Q is at a low level, "enhancing the level of the first node Q" means pulling down the level of the first node Q to further reduce the level of the first node Q. The following embodiments are illustrated by taking pulling up the level of the first node Q as an example.

For example, as shown in FIG. 1, the charging enhancement circuit 300 is connected with the first node Q, and the charging enhancement circuit 300 is configured to receive the charging enhancement signal CE. When the charging enhancement circuit 300 is turned on under control of the level of the first node Q, the charging enhancement signal CE may be used for further enhancing the level of the first node Q. For example, in some embodiments, the charging enhancement circuit 300 is configured to receive a second clock signal CLKB as the charging enhancement signal CE, so that the second clock signal CLKB may be used for increasing the level of the first node Q when the charging enhancement circuit 300 is turned on. For example, a capacitor may be set in the charging enhancement circuit 300 to enhance the level of the first node Q by means of a boosting effect of the capacitor.

For example, in the display period of one frame, after the first input circuit 100 charges the first node Q, and prior to the output circuit 200 outputting the shift signal CR and the first output signal OUT1, the charging enhancement circuit 300 may further pull up the level of the first node Q in response to the charge enhancement signal CE, thereby providing a higher level at the first node Q, avoiding an abnormal output of the output circuit 200, and improving reliability of the shift register unit 10.

In the shift register unit 10 of the embodiments of the present disclosure, by providing the charging enhancement circuit 300, the level of the first node Q may be further enhanced before the drive signals (the shift signal CR, the first output signal OUT1, etc.) are output, thereby avoiding abnormal output and improving the reliability of the shift register unit 10.

Figure 2:
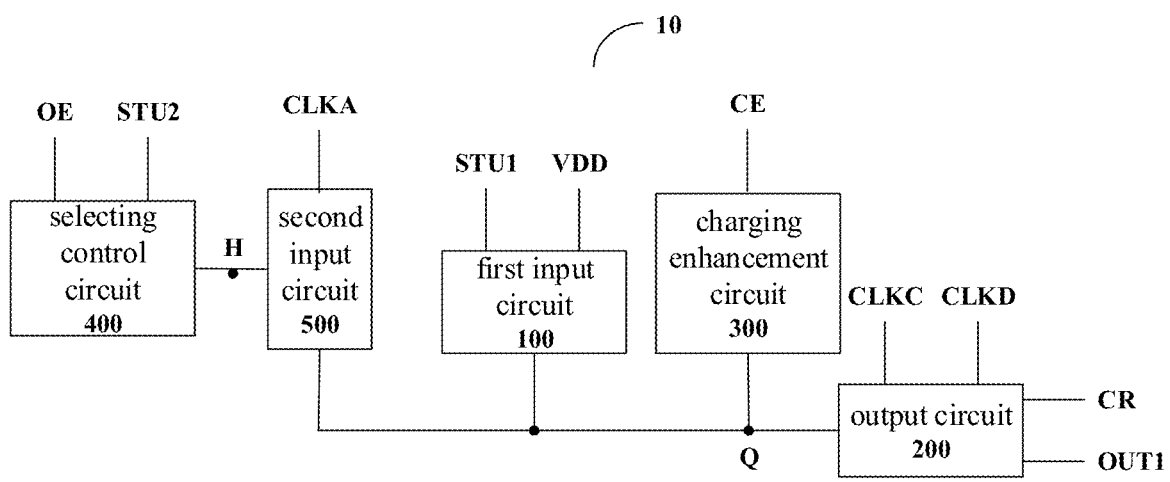
FIG. 2 is a schematic diagram illustrating another shift register unit according to one embodiment of the present disclosure.

In some embodiments, as shown in FIG. 2, the shift register unit 10 further includes a selecting control circuit 400 and a second input circuit 500.

The selecting control circuit 400 is configured to charge a second node H in response to a selecting control signal OE and maintain a level of the second node H.

For example, as shown in FIG. 2, the selecting control circuit 400 is connected with the second node H and configured to receive the selecting control signal OE and a second input signal STU2. For example, in a display period of a frame, when the selecting control circuit 400 is turned on under control of the selecting control signal OE, the second input signal STU2 may be used for charging the second node H. A high level of the second node H may be maintained from the display period of the frame to a blanking period of the frame. For example, in the selecting control circuit 400, a capacitor may be set to maintain the level of the second node H.

For example, when the plurality of the shift register units 10 are connected in cascades to form the gate driver, one stage of the shift register units 10 may receive the shift signal CR output by the current stage (or other stage) of the shift register units 10 as the second input signal STU2. For example, when it is necessary to select one stage of the shift register units 10 to output the driving signal in the blanking period of one frame, a waveform timing of the selecting control signal OE provided to the stage of the shift register units 10 may be the same as that of the second input signal STU2 provided to the stage of the shift register units 10 in the display period of one frame, thus the selecting control circuit 400 of the stage of the shift register units 10 is turned on.

In the embodiments of the present disclosure, it should be appreciated that, the selecting control signal OE may be provided by a control circuit. For example, in one example, the control circuit may be a Field Programmable Gate Array (FPGA) device or other signal generating circuits.

In addition, it should be appreciated that, in the embodiments of the present disclosure, two timing sequences are the same, which refers to time synchronization at a high level, without requiring same amplitude of two signals.

The second input circuit 500 is configured to charge the first node Q under control of the level of the second node H.

For example, as shown in FIG. 2, the second input circuit 500 is connected with the first node Q and the second node H, and the second input circuit 500 is configured to receive a first clock signal CLKA. For example, in the blanking period of one frame, when the second input circuit 500 is turned on under control of the level of the second node H, the first node Q may be charged by using the first clock signal CLKA. For example, in some other embodiments, the second input circuit 500 may also be configured to receive the second voltage VDD, so that the first node Q may be charged by using a high level of the second voltage VDD when the second input circuit 500 is turned on.

For example, in the blanking period of one frame, after the second input circuit 500 completes charging the first node Q, the charging enhancement circuit 300 may further enhance the level of the first node Q in response to the charging enhancement signal CE, thus providing a higher level at the first node Q, avoiding the abnormal output of the output circuit 200, and improving the reliability of the shift register unit 10.

In the shift register unit 10 of the embodiments of the present disclosure, by providing the selecting control circuit 400 and the second input circuit 500, the gate driver formed by the shift register unit 10 may drive one display panel to perform the external compensation in the blanking period of one frame.

For example, the gate driver may drive one display panel to realize the row-by-row sequential compensation. For example, in a first frame, the gate driver outputs a driving signal for driving a first row of sub-pixel units, and in a second frame, the gate driver outputs a driving signal for driving a second row of sub-pixel units, and so on, thereby performing the row-by-row sequential compensation for the display panel.

For example, the gate driver may drive one display panel to realize the random compensation. For example, in one frame, the gate driver outputs a driving signal for a randomly selected row of the sub-pixel units, thereby realizing the random compensation for the display panel.

As described above, the shift register unit 10 in the embodiments of the present disclosure may output the driving signal not only in the display period but also in the blanking period, so that the random compensation may also be realized while the row-by-row sequential compensation is accomplished (for example the row-by-row sequential compensation is required in the shutdown detection), which may avoid poor display problems such as the scanning line and the uneven display brightness caused by the row-by-row sequential compensation.

Meanwhile, in the shift register unit 10 of the embodiments of the present disclosure, in the display period and the blanking period of one frame, after the first input circuit 100 or the second input circuit 500 completes charging the first node Q, the charging enhancement circuit 300 may further enhance the level of the first node Q, thus providing a higher level at the first node Q, avoiding the abnormal output of the output circuit 200, and improving the reliability of the shift register unit 10.

It should be appreciated that, in the embodiments of the present disclosure, charging a node (e.g., the first node Q, the second node H) means, for example, electrically connecting the node with a high-level voltage signal, thereby utilizing the high-level voltage signal to pull up the level of the node. For example, a capacitor electrically connected with the node may be set, and charging the node means charging the capacitor electrically connected with the node.

Figure 3:
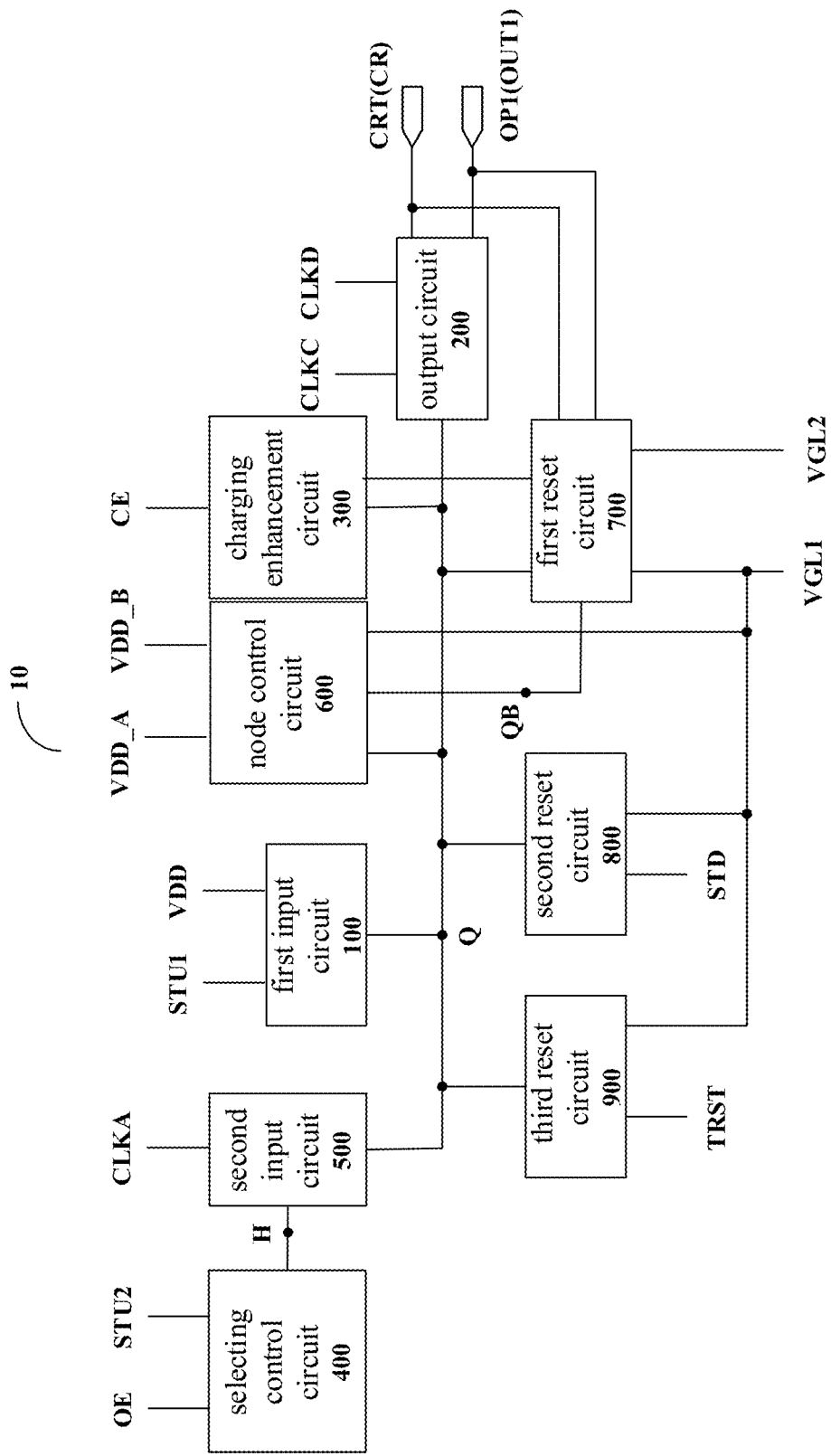
FIG. 3 is a schematic diagram illustrating still another shift register unit according to one embodiment of the present disclosure.

In some embodiments, as shown in FIG. 3, the shift register unit 10 further includes a node control circuit 600 configured to control a level of a third node QB under control of the level of the first node Q.

For example, as shown in FIG. 3, the node control circuit 600 is connected with the first node Q and the third node QB, and the node control circuit 600 is configured to receive a third voltage VDD_A, a fourth voltage VDD_B and a first voltage VGL1.

For example, in embodiments of the present disclosure, the third voltage VDD_A and the fourth voltage VDD_B may be opposite to each other in phase. For example, when the third voltage VDD_A is at a high level, the fourth voltage VDD_B is at a low level; and when the fourth voltage VDD_B is at a high level, the third voltage VDD_A is at a low level, i.e., one of the third voltage VDD_A and the fourth voltage VDD_B is at a high level at a same time point.

For example, when the first node Q is at a high level, the node control circuit 600 may pull down the level of the third node QB by using a low level of the first voltage VGL1. For example, when the first node Q is a low level, the node control circuit 600 may charge the third node QB by using the third voltage VDD_A or the fourth voltage VDD_B to pull up the level of the third node QB to a high level.

In the embodiment of the present disclosure, the node control circuit 600 receives the third voltage VDD_A and the fourth voltage VDD_B, and that one of the third voltage VDD_A and the fourth voltage VDD_B is at a high level is guaranteed, which may further improve the reliability of the shift register unit.

In some embodiments, as shown in FIG. 3, the output terminal of the shift register unit 10 includes a shift signal output terminal CRT and a first output signal terminal OP1, the shift signal output terminal CRT is configured to output the shift signal CR, and the first output signal terminal OP1 is configured to output the first output signal OUT1.

For example, in the display period of one frame, the shift signal CR output by the shift signal output terminal CRT may be provided to other shift register units 10 as the first input signal STU1, thus completing the row-by-row shift of the display scanning; the first output signal OUT1 output by the first output signal terminal OP1 may drive one row of the sub-pixel units in the display panel to perform the display scanning. For example, in some embodiments, a timing sequence of the shift signal output CRT is the same as that of the first output signal OP1. For example, in the blanking period of one frame, the first output signal OUT1 output by the first output signal terminal OP1 may be used for driving the sensing transistor in one row of the sub-pixel units of the display panel to complete the external compensation of the row of sub-pixel unit.

In the shift register unit 10 of the embodiments of the present disclosure, a driving capability of the shift register unit 10 may be improved by providing two signal output terminals (the shift signal output terminal CRT and the first output signal terminal OP1).

It should be appreciated that, in some embodiments, the shift register unit 10 is provided with merely the shift signal output CRT, without the first output signal terminal OP1, such that the shift signal output terminal CRT outputs both the shift signal CR and the first output signal OUT1.

In some embodiments, as shown in FIG. 3, the shift register unit 10 further includes a first reset circuit 700 configured to reset the first node Q, the shift signal output terminal CRT, the first output signal terminal OP1 and the charging enhancement circuit 300 under control of the level of the third node QB.

For example, as shown in FIG. 3, the first reset circuit 700 is connected with the third node QB, the first node Q, the shift signal output terminal CRT, the first output signal terminal OP1 and the charge enhancement circuit 300, and the first reset circuit 700 is configured to receive the first voltage VGL1 and a fifth voltage VGL2.

For example, when the first reset circuit 700 is turned on under control of the level of the third node QB, the first node Q, the shift signal output terminal CRT and the charge enhancement circuit 300 can be reset by the first voltage VGL1, and the first output signal terminal OP1 can be reset by the fifth voltage VGL2.

It should be appreciated that, in the embodiments of the present disclosure, the fifth voltage VGL2 is at a low level, for example. In some examples, the first voltage VGL1 and the fifth voltage VGL2 may be the same, e.g., the first voltage VGL1 is −10V, and the fifth voltage VGL2 is also −10V. In other examples, the first voltage VGL1 and the fifth voltage VGL2 may be different, e.g., the first voltage VGL1 is −6V and the fifth voltage VGL2 is −10V.

In addition, the first reset circuit 700 may reset the first output signal terminal OP1 by using the first voltage VGL1 without receiving the fifth voltage VGL2, which is not limited by the embodiment of the present disclosure.

In some embodiments, as shown in FIG. 3, the shift register unit further includes a second reset circuit 800 and a third reset circuit 900.

The second reset circuit 800 is configured to reset the first node Q in response to a display reset signal STD. For example, as shown in FIG. 3, the second reset circuit 800 is connected with the first node Q, and the second reset circuit 800 is configured to receive the display reset signal STD and the first voltage VGL1. When the second reset circuit 800 is turned on under control of the display reset signal STD, the first node Q can be reset by the low level first voltage VGL1.

For example, when the plurality of the shift register units 10 are connected in cascades to form the gate driver, besides the last stages (e.g. last three stages) of the shift register units, the other stages of shift register units 10 may be connected with an adjacent (e.g., last third stage) shift register unit 10 to receive the shift signal, so that the shift signal may be used as the display reset signal STD of the current stage of the shift register units. The last stages (e.g. last three stages) shift register units may be connected with a separate signal line to receive the display reset signal STD.

In addition, in the embodiments of the present disclosure, "previous" and "next" are based on a scanning direction, "previous second stage of the shift register units" represents a second stage of the shift register units preceding the current stage of the shift register units, and "the next third stage of the shift register units" represents a third shift register unit following the current stage of the shift register units, here the terms "previous" and "next" are relative concepts, which also applies to the following embodiments, and a description thereof will not be repeated.

The third reset circuit 900 is configured to reset the first node Q in response to a global reset signal TRST. For example, as shown in FIG. 3, the third reset circuit 900 is connected with the first node Q, and the third reset circuit 900 is configured to receive the global reset signal TRST and the first voltage VGL1. When the third reset circuit 900 is turned on under control of the global reset signal TRST, the first node Q can be reset by the low level first voltage VGL1.

For example, when the plurality of the shift register units 10 are connected in cascades to form the gate driver, before the display period of one frame, the third reset circuit 900 in each shift register unit 10 is turned on in response to the global reset signal TRST, and then the first node Q is reset, thus a global reset of the gate driver is completed.

In addition, it should be appreciated that, in the embodiments of the present disclosure, the nodes (first node Q, second node H and third node QB) are arranged to better describe a circuit structure, not to represent actual components. The node represents a junction point of connections of related circuit in the circuit structure, i.e. the related circuits connecting with a same node identification are connected with each other electrically. For example, as shown in FIG. 3, the first input circuit 100, the output circuit 200, the charging enhancement circuit 300, the second input circuit 500 and the node control circuit 600 are all connected with the first node Q, which means that these circuits are electrically connected with each other.

Those skilled in the art may understands that, although the shift register unit 10 in FIG. 3 shows the node control circuit 600, the first reset circuit 700, the second reset circuit 800 and the third reset circuit 900, which does not limit the protection scope of the present disclosure. In practical applications, technicians may choose to use or not use one or more of the above-mentioned circuits according to needs. Various variants of combinations of the above-mentioned circuits do not depart from the present disclosure, which will not be repeated.

Figure 4:
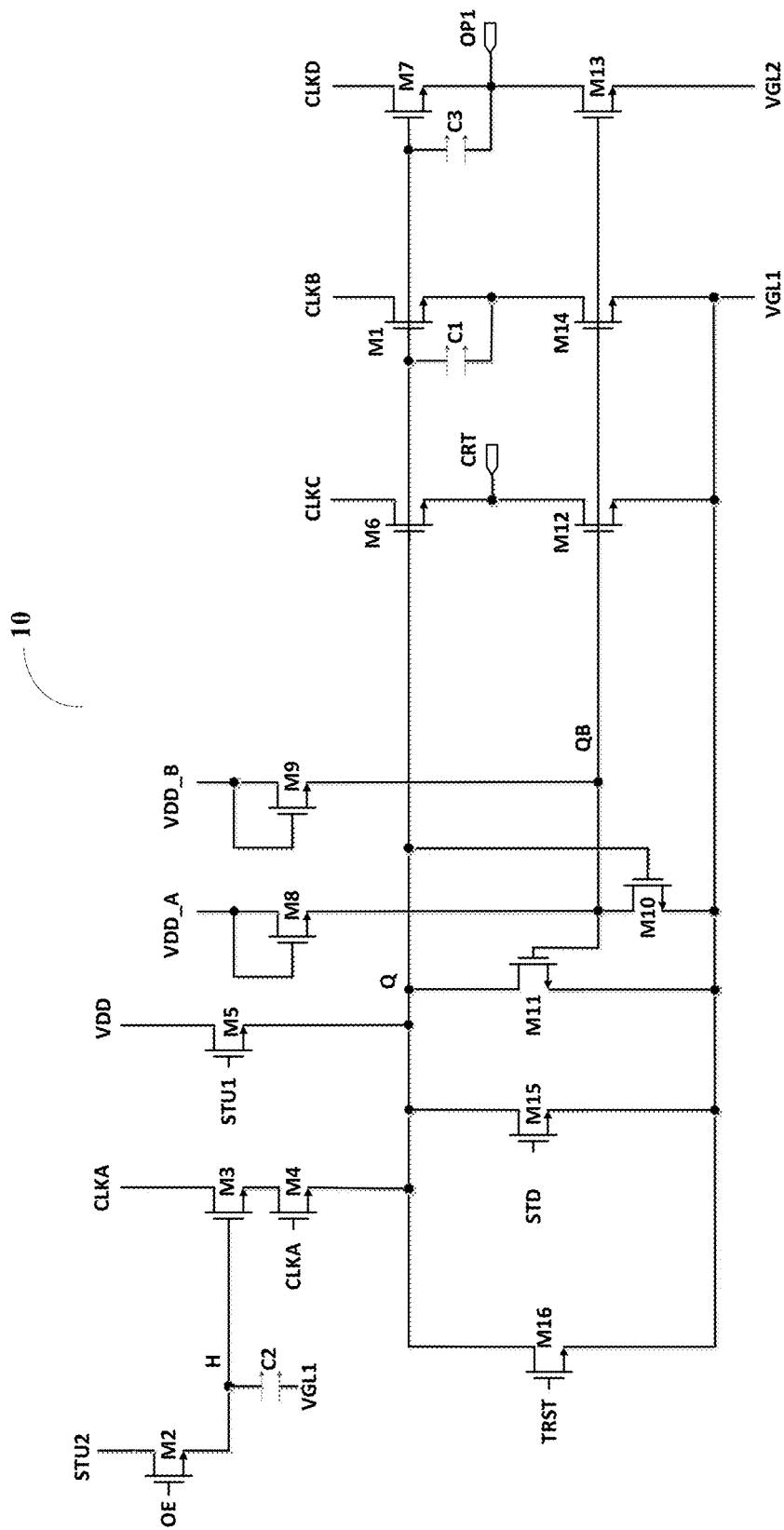
FIG. 4 is a schematic diagram illustrating a circuit of a shift register unit according to one embodiment of the present disclosure.

In one embodiment of the present disclosure, the shift register unit 10 shown in FIG. 3 may be implemented by a circuit structure shown in FIG. 4. As shown in FIG. 4, the shift register unit 10 includes a first transistor to a sixteenth transistor M1-M16, a first capacitor C1, a second capacitor C2 and a third capacitor C3. It should be appreciated that, the following examples are described by taking that the transistors shown in FIG. 4 are all N-type thin film transistors as an example.

As shown in FIG. 4, the charging enhancement circuit 300 may include the first transistor M1 and the first capacitor C1. A gate of the first transistor M1 is connected with the first node Q. A first electrode of the first transistor M1 is configured to receive the second clock signal CLKB as the charge enhancement signal CE. A second electrode of the first transistor M1 is connected with a first electrode of the first capacitor C1, and a second electrode of the first capacitor C1 is connected with the first node Q. For example, when the first node Q is at a high level, the first transistor M1 is turned on. The second clock signal CLKB (such as a high level) received by the first electrode of the first transistor M1 is transmitted to the first electrode of the first capacitor C1. Due to a boosting effect of the first capacitor C1, the second clock signal CLKB may improve the level of the second electrode of the first capacitor C1 which is the level of the first node Q.

As shown in FIG. 4, the selecting control circuit 400 may include a second transistor M2 and a second capacitor C2. A gate of the second transistor M2 is configured to receive the selecting control signal OE, a first electrode of the second transistor M2 is configured to receive the second input signal STU2, a second electrode of the second transistor M2 is connected with the second node H. For example, when the selecting control signal OE is a high level, the second transistor M2 is turned on, so that the second node H may be charged by using the second input signal STU2 (such as a high level).

A first electrode of the second capacitor C2 is connected with the second node H, and a second electrode of the second capacitor C2 is configured to receive the first voltage VGL1. By providing the second capacitor C2, the level of the second node H may be maintained. It should be appreciated that, in the embodiments of the present disclosure, the second electrode of the second capacitor C2 may be configured to receive other fixed level signals besides the first voltage VGL1, for example, the second electrode of the second capacitor C2 is grounded, which is not limited by the embodiments of the present disclosure.

As shown in FIG. 4, the second input circuit 500 may include a third transistor M3 and a fourth transistor M4. A gate of the third transistor M3 is connected with the second node H, a first electrode of the third transistor M3 is configured to receive the first clock signal CLKA, a second electrode of the third transistor M3 is connected with a first electrode of the fourth transistor M4; and a gate of the fourth transistor M4 is configured to receive the first clock signal CLKA, and a second electrode of the fourth transistor M4 is connected with the first node Q.

For example, when the second node H is at a high level and the first clock signal CLKA is a high level, the third transistor M3 and the fourth transistor M4 are turned on, then the first node Q may be charged by using the high level of the first clock signal CLKA. For example, in other embodiments, the first electrode of the third transistor M3 may also be configured to receive the second voltage VDD which is a high level. When the third transistor M3 and the fourth transistor M4 are turned on, the first node Q may be charged by the high level of the second voltage VDD.

As shown in FIG. 4, the first input circuit 100 may include a fifth transistor M5. A gate of the fifth transistor M5 is configured to receive the first input signal STU1, a first electrode of the fifth transistor M5 is configured to receive the second voltage VDD, and a second electrode of the fifth transistor M5 is connected with the first node Q. For example, when the first input signal STU1 is a high level, the fifth transistor M5 is turned on, then the first node Q may be charged by using the high level of the second voltage VDD. For example, in other embodiments, the first electrode of the fifth transistor M5 may also be configured to receive the first input signal STU1. When the fifth transistor M5 is turned on, the first node Q may be charged by the first input signal STU1.

As shown in FIG. 4, the output circuit 200 may include a sixth transistor M6, a seventh transistor M7, a third capacitor C3, the shift signal output terminal CRT and the first output signal terminal OP1. The shift signal output terminal CRT is configured to output the shift signal CR; the first output signal terminal OP1 is configured to output the first output signal OUT1. The driving capability of the shift register unit 10 may be improved by providing two signal output terminals.

A gate of the sixth transistor M6 is connected with the first node Q, a first electrode of the sixth transistor M6 is configured to receive the third clock signal CLKC as the shift signal CR, and a second electrode of the sixth transistor M6 is connected with the shift signal output terminal CRT. A gate of the seventh transistor M7 is connected with the first node Q, a first electrode of the seventh transistor M7 is configured to receive a fourth clock signal CLKD as the first output signal OUT1, and a second electrode of the seventh transistor M7 is connected with the first output signal terminal OP1; and a first electrode of the third capacitor C3 is connected with the first node Q, and a second electrode of the third capacitor C3 is connected with the first output signal terminal OP1.

For example, when the first node Q is at a high level, the sixth transistor M6 is turned on, then the third clock signal CLKC may be output to the shift signal output terminal CRT as the shift signal CR; while the seventh transistor M7 is turned on, then the fourth clock signal CLKD may be output to the first output signal OP1 as the first output signal OUT1.

It should be appreciated that, in some embodiments, the third clock signal CLKC and the fourth clock signal CLKD may be the same, in this case, the first electrode of the seventh transistor M7 is connected with the first electrode of the sixth transistor M6, then there is no need to provide the fourth clock signal CLKD to the shift register unit 10, thereby a clock signal line is saved. In other embodiments, the third clock signal CLKC and the fourth clock signal CLKD may be different. The embodiments of the present disclosure do not limit setting modes of the third clock signal CLKC and the fourth clock signal CLKD.

In addition, in the shift register unit 10 shown in FIG. 4, the third clock signal CLKC received by the first electrode of the sixth transistor M6 may also be used as the first output signal OUT1, and the shift signal output terminal CRT may also be configured to output the first output signal OUT1. That is to say, there is no need to provide the seventh transistor M7, the third capacitor C3 and the first output signal OP1, the driving signal output by the shift signal output terminal CRT may be used as both the shift signal CR and the first output signal OUT1.

As shown in FIG. 4, the node control circuit 600 may include an eighth transistor M8, a ninth transistor M9 and a tenth transistor M10. A gate of the eighth transistor M8 is connected with a first electrode of the eighth transistor M8, the eighth transistor M8 is configured to receive the third voltage VDD_A, and a second electrode of the eighth transistor M8 is connected with the third node QB. A gate of the ninth transistor M9 is connected with a first electrode of the ninth transistor M9, the ninth transistor M9 is configured to receive the fourth voltage VDD_B, and a second electrode of the ninth transistor M9 is connected with the third node QB. A gate of the tenth transistor M10 is connected with the first node Q, a first electrode of the tenth transistor M10 is connected with the third node QB, and a second electrode of tenth transistor M10 is configured to receive the first voltage VGL1.

As mentioned above, the third voltage VDD_A and the fourth voltage VDD_B may be opposite to each other in phase. For example, when the third voltage VDD_A is a high level, the fourth voltage VDD_B is a low level. In this case, only one of the eighth transistor M8 and ninth transistor M9 is turned on, which may avoid a performance drift caused by a long-term on-state of the transistor, and further enhance the reliability of the circuit.

When the eighth transistor M8 or the ninth transistor M9 is turned on, the third node QB may be charged by using the third voltage VDD_A or the fourth voltage VDD_B, then the third node QB becomes a high level. When the first node Q is at a high level, the tenth transistor M10 is turned on. For example, when designing the transistors, the tenth transistor M10 and the eighth transistor M8 (or the ninth transistor M9) may be configured (for example, a size ratio of the tenth transistor M10 to the eighth transistor M8, the threshold voltage, etc. may be configured) to that when the tenth transistor M10 and the eighth transistor M8 (or the ninth transistor M9) are both turned on, the level of the third node QB may be pulled down to a low level, such that an eleventh transistor M11, a twelfth transistor M12, a thirteenth transistor M13 and a fourteenth transistor M14 are kept in a turn-off state.

As shown in FIG. 4, the first reset circuit 700 may include the eleventh transistor M11, the twelfth transistor M12, the thirteenth transistor M13 and the fourteenth transistor M14. A gate of the eleventh transistor M11 is connected with the third node QB, a first electrode of the eleventh transistor M11 is connected with the first node Q, and a second electrode of the eleventh transistor M11 is configured to receive the first voltage VGL1. A gate of the twelfth transistor M12 is connected with the third node QB, a first electrode of the twelfth transistor M12 is connected with the shift signal output terminal CRT, and a second electrode of the twelfth transistor M12 is configured to receive the first voltage VGL1. A gate of the thirteenth transistor M13 is connected with the third node QB, a first electrode of the thirteenth transistor M13 is connected with the first output signal terminal OP1, and a second electrode of the thirteenth transistor M13 is configured to receive the fifth voltage VGL2. A gate of the fourteenth transistor M14 is connected with the third node QB, a first electrode of the fourteenth transistor M14 is connected with the first electrode of the first capacitor C1, and a second electrode of the fourteenth transistor M14 is configured to receive the first voltage VGL1.

For example, when the third node QB is at a high level, the eleventh transistor M11, the twelfth transistor M12, the thirteenth transistor M13 and the fourteenth transistor M14 are turned on, such that the first node Q, the shift signal output terminal CRT and the charge enhancement circuit 300 (i.e. the first capacitor C1) can be reset by the low level of the first voltage VGL1, and the first output signal terminal OP1 can be reset by the low level of the fifth voltage VGL2.

In the embodiment of the present disclosure, for example, when the output circuit 200 completes outputting the driving signal, the charging enhancement circuit 300 (first capacitor C1) can be reset by the first reset circuit 700, thus charges stored in the first capacitor C1 may be released, and the charging enhancement circuit 300 is capable of enhancing the level of the first node Q next time by using the boosting effect of the capacitor C1.

As shown in FIG. 4, the second reset circuit 800 may be implemented by a fifteenth transistor M15. A gate of the fifteenth transistor M15 is configured to receive the display reset signal STD, a first electrode of the fifteenth transistor M15 is connected with the first node Q, and a second electrode of the fifteenth transistor M15 is configured to receive the first voltage VGL1.

For example, when the display reset signal STD is a high level, the fifteenth transistor M15 is turned on, so that the first node Q can be reset by the low level of the first voltage VGL1. It should be appreciated that, the display reset signal STD may refer to corresponding description in the second reset circuit 800 described above, which will not be repeated herein.

As shown in FIG. 4, the third reset circuit 900 may be implemented by a sixteenth transistor M16. A gate of the sixteenth transistor M16 is configured to receive the global reset signal TRST, a first electrode of the sixteenth transistor M16 is connected with the first node Q, and a second electrode of the sixteenth transistor M16 is configured to receive the first voltage VGL1.

For example, when the global reset signal TRST is a high level, the sixteenth transistor M16 is turned on, so that the first node Q can be reset by the low level of the first voltage VGL1.

Figure 5:
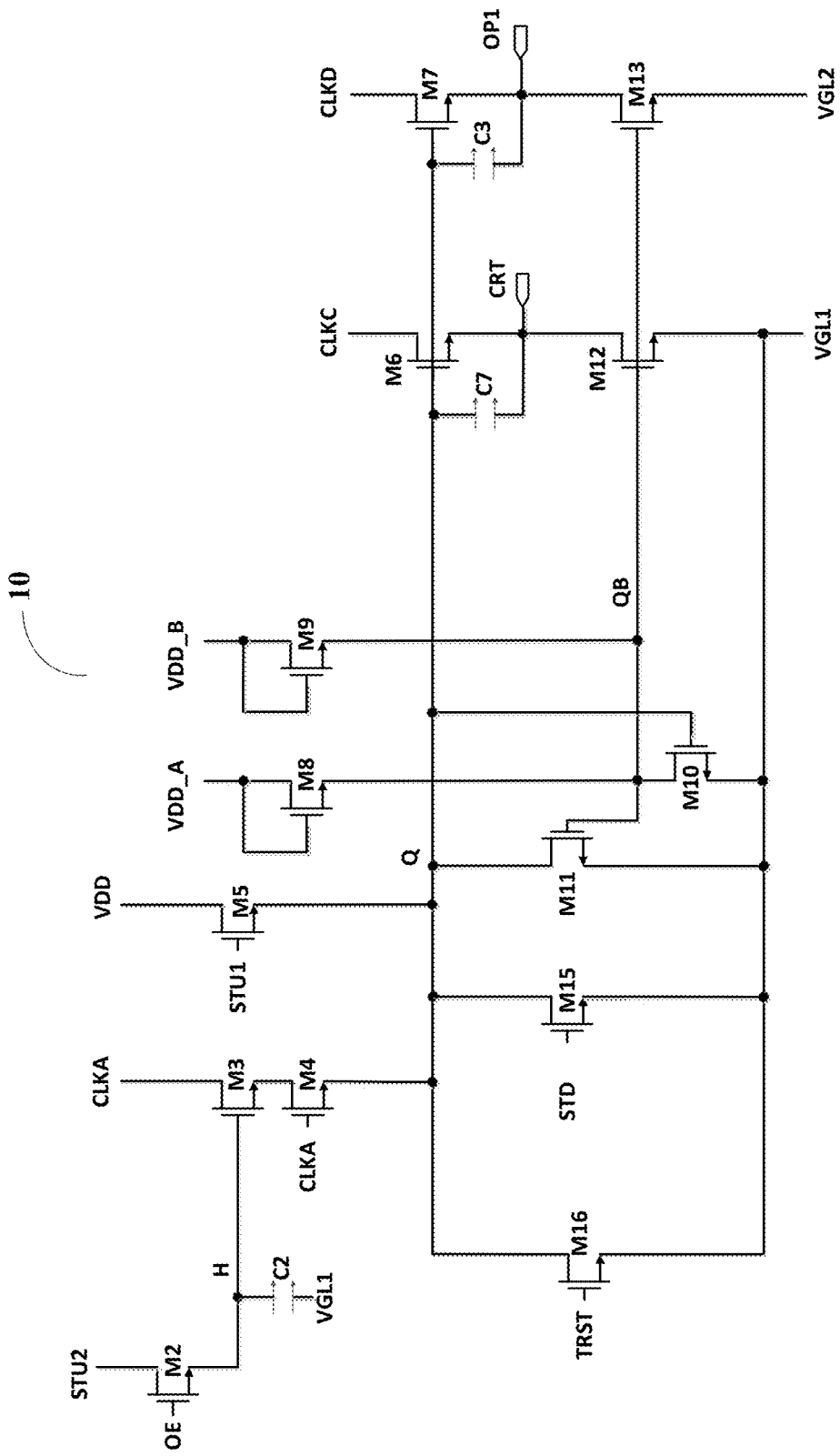
FIG. 5 is a schematic diagram illustrating a circuit of another shift register unit according to one embodiment of the present disclosure.

As shown in FIG. 5, in a shift register unit 10 provided by some embodiments of the present disclosure, as compared with the shift register units 10 shown in FIG. 4, the first transistor M1, the first capacitor C1 and the fourteenth transistor M14 have been removed, and a seventh capacitor C7 is added, in which a first electrode of the seventh capacitor C7 is connected with the first node Q, a second electrode of the seventh capacitor C7 is connected with a terminal of the output circuit 200 which outputs the shift signal CR, i.e., the second electrode of the seventh capacitor C7 is connected with the shift signal output terminal CRT.

In the shift register unit 10 shown in FIG. 5, the charging enhancement circuit 300 is implemented by the seventh capacitor C7. For example, in the blanking period of one frame, the level of the first node Q may be enhanced by the third clock signal CLKC and utilizing a boosting effect of the seventh capacitor C7, thus improving the reliability of the shift register unit 10. The specific operation principle of the shift register unit 10 shown in FIG. 5 will be described below.

Figure 6:
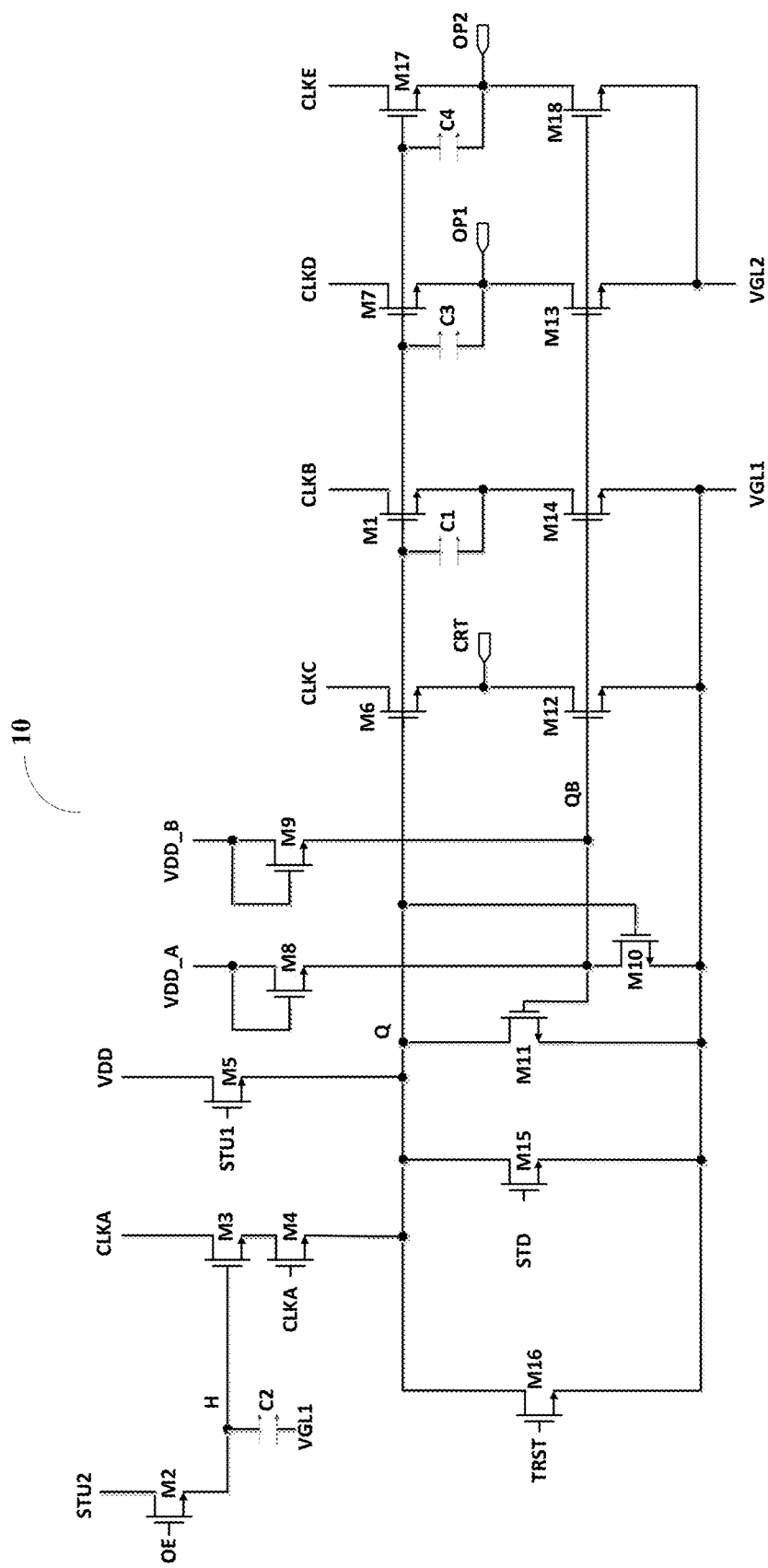
FIG. 6 is a schematic diagram illustrating a circuit of still another shift register unit according to one embodiment of the present disclosure.

As shown in FIG. 6, other embodiments of the present disclosure further provide a shift register unit 10. Compared with the shift register unit 10 shown in FIG. 4, the output circuit 200 in the shift register unit 10 shown in FIG. 6 further includes a seventeenth transistor M17, a fourth capacitor C4 and a second output signal terminal OP2. The second output signal terminal OP2 is configured to output a second output signal OUT2. Accordingly, the first reset circuit 700 is also configured to reset the second output signal terminal OP2 under control of the level of the third node QB. In the shift register unit 10 shown in FIG. 6, the first reset circuit 700 further includes an eighteenth transistor M18.

As shown in FIG. 6, a gate of the seventeenth transistor M17 is connected with the first node Q, a first electrode of the seventeenth transistor M17 is configured to receive a fifth clock signal CLKE, a second electrode of the seventeenth transistor M17 is connected with the second output signal terminal OP2. A first electrode of the fourth capacitor C4 is connected with the first node Q, a second electrode of the fourth capacitor C4 is connected with the second output signal terminal OP2. A gate of the eighteenth transistor M18 is connected with the third node QB, a first electrode of the eighteenth transistor M18 is connected with the second output signal terminal OP2, a second electrode of the eighteenth transistor M18 is configured to receive the fifth voltage VGL2.

For example, in one example, in the blanking period of one frame, the fourth clock signal CLKD and the fifth clock signal CLKE provided to the shift register unit 10 may be configured to be different. When each row of the sub-pixel units in the display panel corresponds to two gate lines, the first output signal terminal OP1 and the second output signal terminal OP2 in the shift register unit 10 shown in FIG. 6 may be connected with the two gate lines in one row of sub-pixel units in the display panel, respectively, then different driving signals may be provided to the two gate lines, thus completing the external compensation of the row of the sub-pixel units.

For example, in another example, in the display period of one frame, the fourth clock signal CLKD and the fifth clock signal CLKE provided to the shift register unit 10 may be configured to have a same period and a duty cycle and be adjacent in timing. It should be appreciated that, that the fourth clock signal CLKD and the fifth clock signal CLKE are adjacent in timing represents that the fourth clock signal CLKD and the fifth clock signal CLKE are provided sequentially to the shift register unit 10 in a time sequence (such as the fourth clock signal CLKD provided by a ninth sub-clock signal line CLK9 and the fifth clock signal CLKE provided by a tenth sub-clock signal line CLK10 shown in FIG. 12). For example, when the fourth clock signal CLKD and the fifth clock signal CLKE are output as the first output signal OUT1 and the second output signal OUT2 respectively, the first output signal OUT1 and the second output signal OUT2 may drive two adjacent rows (such as a $n^{th}$ row and a $(n+1)^{th}$ row) of the sub-pixel units in the display panel respectively. In the following description, being adjacent in timing is the same, and will not be repeated.

In this case, the shift register unit 10 shown in FIG. 6 may be configured to drive two rows of the sub-pixel units in the display panel. For example, the first output signal terminal OP 1 is electrically connected with the $n^{th}$ row of the sub-pixel units in the display panel, the second output signal terminal OP2 is electrically connected with the $(n+1)^{th}$ row of the sub-pixel units in the display panel, and n is an integer larger than zero. Since each shift register unit 10 may drive two rows of the sub-pixel units, an area occupied by the gate driver consisted of the shift register units 10 may be reduced, thus the display device may have a narrow border by using the gate driver.

Figure 7:
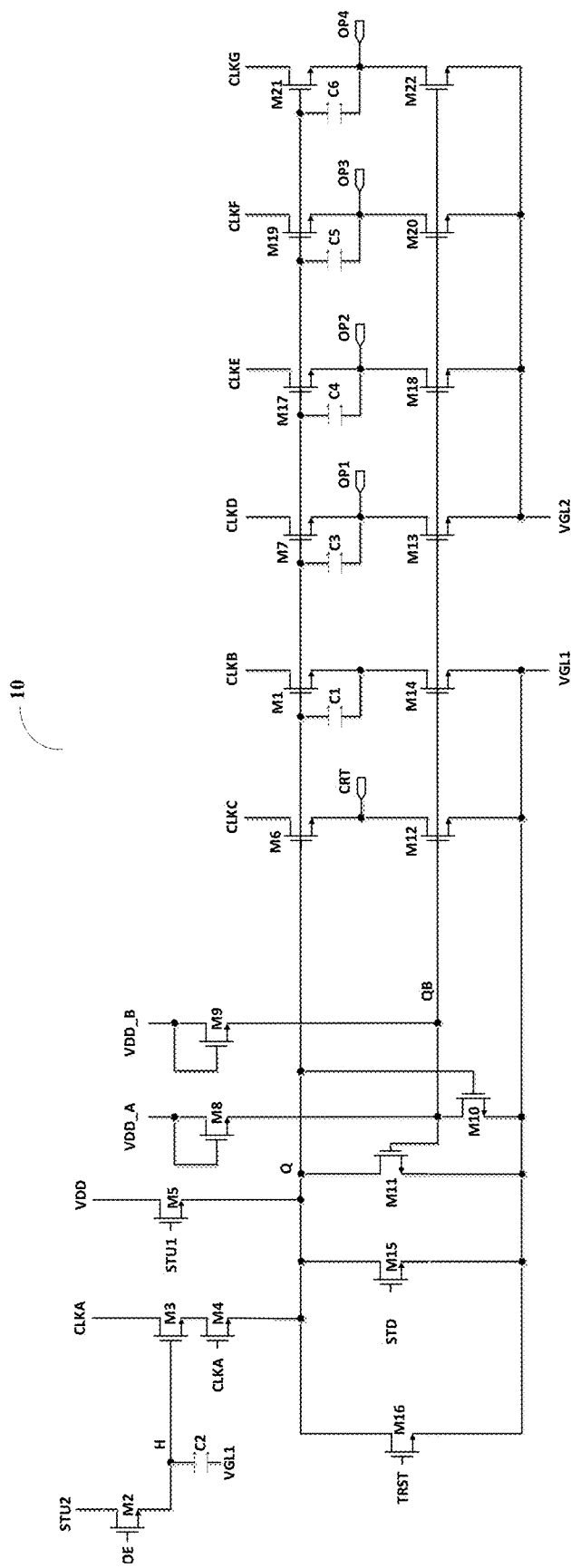
FIG. 7 is a schematic diagram illustrating a circuit of yet still another shift register unit according to one embodiment of the present disclosure.

As shown in FIG. 7, other embodiments of the present disclosure further provide a shift register unit 10. Compared with the shift register unit 10 shown in FIG. 6, the output circuit 200 in the shift register unit 10 shown in FIG. 7 further includes a nineteenth transistor M19, a twenty-first transistor M21, a fifth capacitor C5, a sixth capacitor C6, a third output signal terminal OP3 and a fourth output signal terminal OP4. The output signal terminal OP3 is configured to output a third output signal OUT3, and the fourth output signal terminal OP4 is configured to output a fourth output signal OUT4. Accordingly, the first reset circuit 700 is further configured to reset the third output signal terminal OP3 and the fourth output signal terminal OP4 under control of the level of the third node QB. In the shift register unit 10 shown in FIG. 7, the first reset circuit 700 further includes a twentieth transistor M20 and a twenty-second transistor M22.

As shown in FIG. 7, a gate of the nineteenth transistor M19 is connected with the first node Q, a first electrode of the nineteenth transistor M19 is configured to receive a sixth clock signal CLKF, and a second electrode of the nineteenth transistor M19 is connected with the third output signal terminal OP3. A first electrode of the fifth capacitor C5 is connected with the first node Q, and a second electrode of the fifth capacitor C5 is connected with the third output signal terminal OP3. A gate of the twentieth transistor M20 is connected with the third node QB, a first electrode of the twentieth transistor M20 is connected with the third output signal terminal OP3, and a second electrode of the twentieth transistor M20 is configured to receive the fifth voltage VGL2. A gate of the twenty-first transistor M21 is connected with the first node Q, a first electrode of the twenty-first transistor M21 is configured to receive a seventh clock signal CLKG, and a second electrode of the twenty-first transistor M21 is connected with the fourth output signal terminal OP4. A first electrode of the sixth capacitor C6 is connected with the first node Q, and a second electrode of the sixth capacitor C6 is connected with the fourth output signal terminal OP4. A gate of the twenty-second transistor M22 is connected with the third node QB, a first electrode of the twenty-second transistor M22 is connected with the fourth output signal terminal OP4, and a second electrode of the twenty-second transistor M22 is configured to receive the fifth voltage VGL2.

For example, when each row of the sub-pixel units in the display panel corresponds to two gate lines, the shift register unit 10 shown in FIG. 7 may be configured to drive two rows of the sub-pixel units in the display panel. For example, in the display period of one frame, the fourth clock signal CLKD and the fifth clock signal CLKE provided to the shift register unit 10 may be configured to have a same period and a duty cycle and be adjacent in timing. The sixth clock signal CLKF and the seventh clock signal CLKG provided to the shift register unit 10 may be configured to have a same period and a duty cycle and be adjacent in timing. In the blanking period of one frame, the fourth clock signal CLKD and the sixth clock signal CLKF provided to the shift register unit 10 may be configured to be different, or, the fifth clock signal CLKE and the seventh clock signal CLKG provided to the shift register unit 10 may be configured to be different.

For example, the first output signal terminal OP1 is electrically connected with a first gate line corresponding to the $n^{th}$ row of the sub-pixel units in the display panel, the first output signal OUT1 output by the first output signal terminal OP1 is used to drive the $n^{th}$ row of the sub-pixel units in the display panel. The second output signal terminal OP2 is connected with the first gate line corresponding to a $(n+1)^{th}$ row of the sub-pixel units in the display panel, and the second output signal OUT2 output by the second output signal terminal OP2 is used to drive the $(n+1)^{th}$ row of the sub-pixel units in the display panel. The third output signal terminal OP3 is connected with a second gate line corresponding to the $n^{th}$ row of the sub-pixel units in the display panel electrically, the third output signal OUT3 output by the third output signal terminal OP3 is used to drive the $n^{th}$ row of the sub-pixel units in the display panel. The fourth output signal terminal OP4 is connected with the second gate line corresponding to a $(n+1)^{th}$ row of the sub-pixel units in the display panel, and the fourth output signal OUT4 output by the fourth output signal terminal OP4 is used to drive the $(n+1)^{th}$ row of the sub-pixel units in the display panel, n being an integer larger than zero.

It should be appreciated that, the transistors in the embodiments of the present disclosure may be thin film transistors or field effect transistors or other switching devices with same characteristics, and the embodiments of the present disclosure are illustrated by taking the thin film transistors as examples. Source electrode and drain electrode of the transistor may be symmetrical in structure, so the source electrode and drain electrode of the transistor may be undifferentiated in structure. In the embodiments of the present disclosure, in order to distinguish two electrodes of the transistor other than a gate, one electrode is referred to as a first electrode and the other electrode is referred to as a second electrode. In addition, according to characteristics of the transistors, the transistors may be divided into N-type transistors and P-type transistors. When the transistor is a P-type transistor, a turn-on voltage is a low-level voltage (such as 0V, −5V, −10V or other suitable voltage), a turn-off voltage is a high-level voltage (such as 5V, 10V or other suitable voltage); when the transistor is a N-type transistor, a turn-on voltage is a high-level voltage (such as 5V, 10V or other suitable voltage), and a turn-off voltage is a low-level voltage (such as 0V, −5V, −10V or other suitable voltage).

In addition, it should be appreciated that, the embodiments of the present disclosure are illustrated by taking that the transistors in the shift register unit 10 are all the N-type transistors as an example. The embodiments of the present disclosure are not limited thereto, for example, at least some transistors in the shift register unit 10 may be the P-type transistors.

Figure 8:
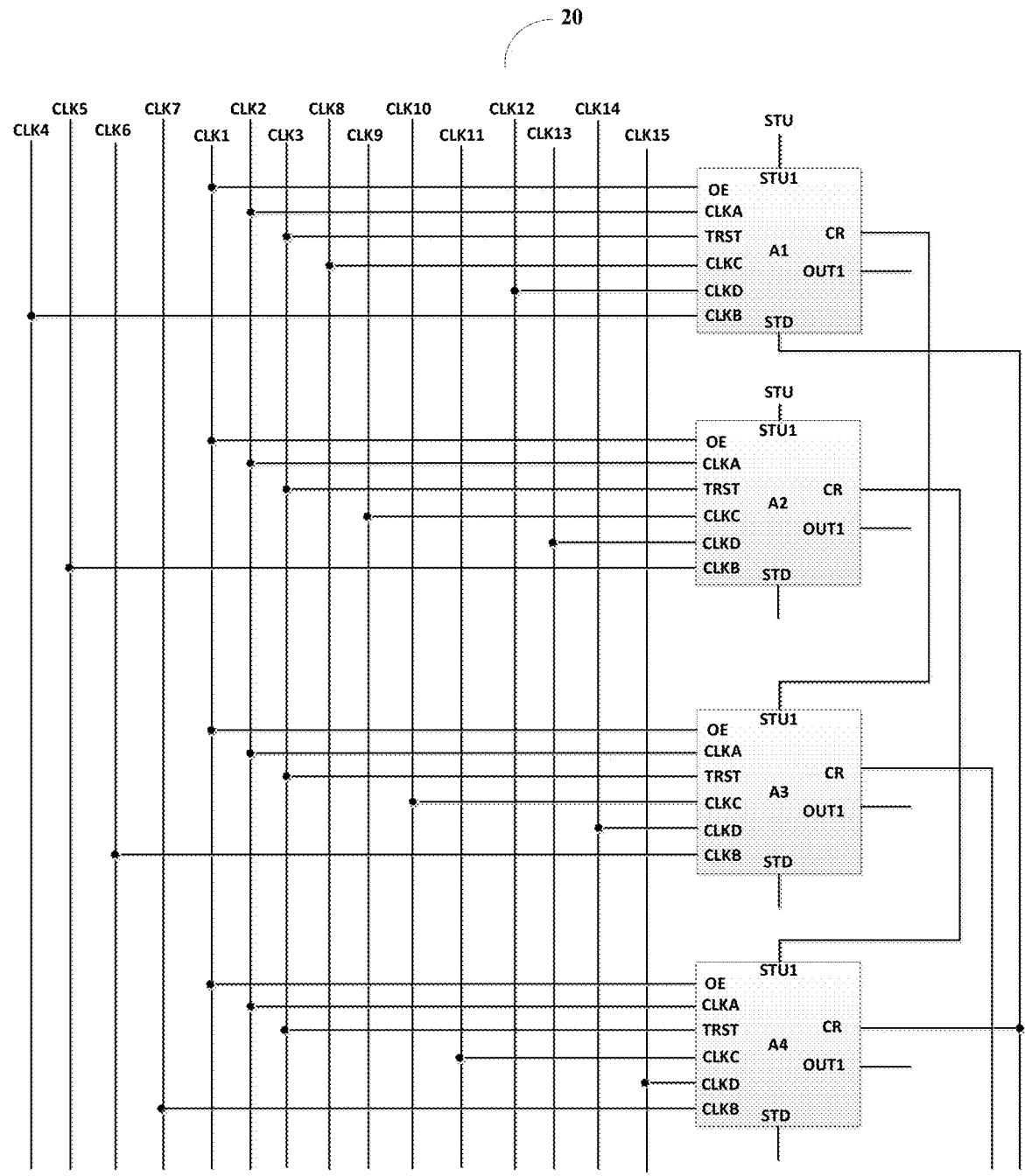
FIG. 8 is a schematic diagram illustrating a gate driver according to one embodiment of the present disclosure.

Some embodiments of the present disclosure further provides a gate driver 20, as shown in FIG. 8, the gate driver 20 includes a plurality of the shift register units 10 connected in cascades, the shift register units 10 may have the structure of the shift register unit 10 shown in FIG. 4 or a variant thereof, for example. It should be appreciated that, only the first four stages of shift register units (A1, A2, A3 and A4) of the gate driver 20 are schematically shown in FIG. 8, and the embodiments of the present disclosure are not limited thereto.

For example, as shown in FIG. 8, the first output signal OUT1 output by each shift register unit 10 may be used for driving different rows of the sub-pixel units in the display panel, for example, driving the scanning transistor or the sensing transistor in the sub-pixel unit. For example, A1, A2, A3 and A4 may drive a first row of the sub-pixel units, a second row of the sub-pixel units, a third row of the sub-pixel units and a fourth row of the sub-pixel units in the display panel, respectively.

As shown in FIG. 8, the gate driver 20 further includes a first sub-clock signal line CLK1, a second sub-clock signal line CLK2 and a third sub-clock signal line CLK3.

Each stage of the shift register units is connected with the first sub-clock signal line CLK1 to receive the selecting control signal OE; each stage of the shift register units is connected with the second sub-clock signal line CLK2 to receive the first clock signal CLKA; each stage of the shift register units is connected with the third sub-clock signal line CLK3 to receive the global reset signal TRST.

As shown in FIG. 8, the gate driver 20 further includes a fourth sub-clock signal line CLK4, a fifth sub-clock signal line CLK5, a sixth sub-clock signal line CLK6 and a seventh sub-clock signal line CLK7.

A $(4n−3)^{th}$ stage of the shift register units is connected with the fourth sub-clock signal line CLK4 to receive the second clock signal CLKB; a $(4n−2)^{th}$ stage of the shift register units is connected with the fifth sub-clock signal line CLK5 to receive the second clock signal CLKB; a $(4n-1)^{th}$ stage of the shift register units is connected with the sixth sub-clock signal line CLK6 to receive the second clock signal CLKB; a $(4n)^{th}$ stage of the shift register units is connected with the seventh sub-clock signal line CLK7 to receive the second clock signal CLKB; n is an integer larger than zero. In this embodiment, the second clock signal CLKB provided by the fourth sub-clock signal line CLK4, the fifth sub-clock signal line CLK5, the sixth sub-clock signal line CLK6 and the seventh sub-clock signal line CLK7 is a 4CLK clock signal.

As shown in FIG. 8, the gate driver 20 further includes an eighth sub-clock signal line CLK8, a ninth sub-clock signal line CLK9, a tenth sub-clock signal line CLK10 and an eleventh sub-clock signal line CLK11.

The $(4n-3)^{th}$ stage of the shift register units is connected with the eighth sub-clock signal line CLK8 to receive the third clock signal CLKC; the $(4n-2)^{th}$ stage of the shift register units is connected with the ninth sub-clock signal line CLK9 to receive the third clock signal CLKC; the $(4n-1)^{th}$ stage of the shift register units is connected with the tenth sub-clock signal line CLK10 to receive the third clock signal CLKC; the $(4n)^{th}$ stage of the shift register units is connected with the eleventh sub-clock signal line CLK11 to receive the third clock signal CLKC; n is an integer larger than zero. In this embodiment, the third clock signal CLKC provided by the eighth sub-clock signal line CLK8, the ninth sub-clock signal line CLK9, the tenth sub-clock signal line CLK10 and the eleventh sub-clock signal line CLK11 is a 4CLK clock signal.

As shown in FIG. 8, the gate driver 20 further includes a twelfth sub-clock signal line CLK12, a thirteenth sub-clock signal line CLK13, a fourteenth sub-clock signal line CLK14 and a fifteenth sub-clock signal line CLK15.

The $(4n-3)^{th}$ stage of the shift register units is connected with the twelfth sub-clock signal line CLK12 to receive the fourth clock signal CLKD; the $(4n-2)^{th}$ stage of the shift register units is connected with the thirteenth sub-clock signal line CLK13 to receive the fourth clock signal CLKD; the $(4n-1)^{th}$ stage of the shift register units is connected with the fourteenth sub-clock signal line CLK14 to receive the fourth clock signal CLKD; the $(4n)^{th}$ stage of the shift register units is connected with the fifteenth sub-clock signal line CLK15 to receive the fourth clock signal CLKD; n is an integer larger than zero. In this embodiment, the fourth clock signal CLKD provided by the twelfth sub-clock signal line CLK12, the thirteenth sub-clock signal line CLK13, the fourteenth sub-clock signal line CLK14 and the fifteenth sub-clock signal line CLK15 is a 4CLK clock signal.

As shown in FIG. 8, a $(n+2)^{th}$ stage of the shift register units is connected with a $n^{th}$ stage of the shift register units, for example, the $(n+2)^{th}$ stage of the shift register units is connected with the shift signal output terminal CRT of the $n^{th}$ stage of the shift register units, to receive the shift signal CR output by the $n^{th}$ stage of the shift register units as the first input signal STU1 of the $(n+2)^{th}$ stage of the shift register units; the $n^{th}$ stage of the shift register units is connected with a $(n+3)^{th}$ stage of the shift register units, for example, the $n^{th}$ stage of the shift register units is connected with the shift signal output terminal CRT of the $(n+3)^{th}$ stage of the shift register units, to receive the shift signal CR output by the $(n+3)^{th}$ stage of the shift register units as the display reset signal STD of the $n^{th}$ stage of the shift register units; n is an integer larger than zero. It should be appreciated that, in the gate driver 20 shown in FIG. 8, the shift signal output by the $n^{th}$ stage of the shift register units is used as the second input signal STU2 of the current stage of the shift register units.

It should be appreciated that, the cascade connection shown in FIG. 8 is only an example, according to the description of the present disclosure, other cascade connections may be adopted according to practical applications. For example, when the clock signals are different, the cascaded connection relationship among respective stages of the shift register units may be changed accordingly.

Figure 9:
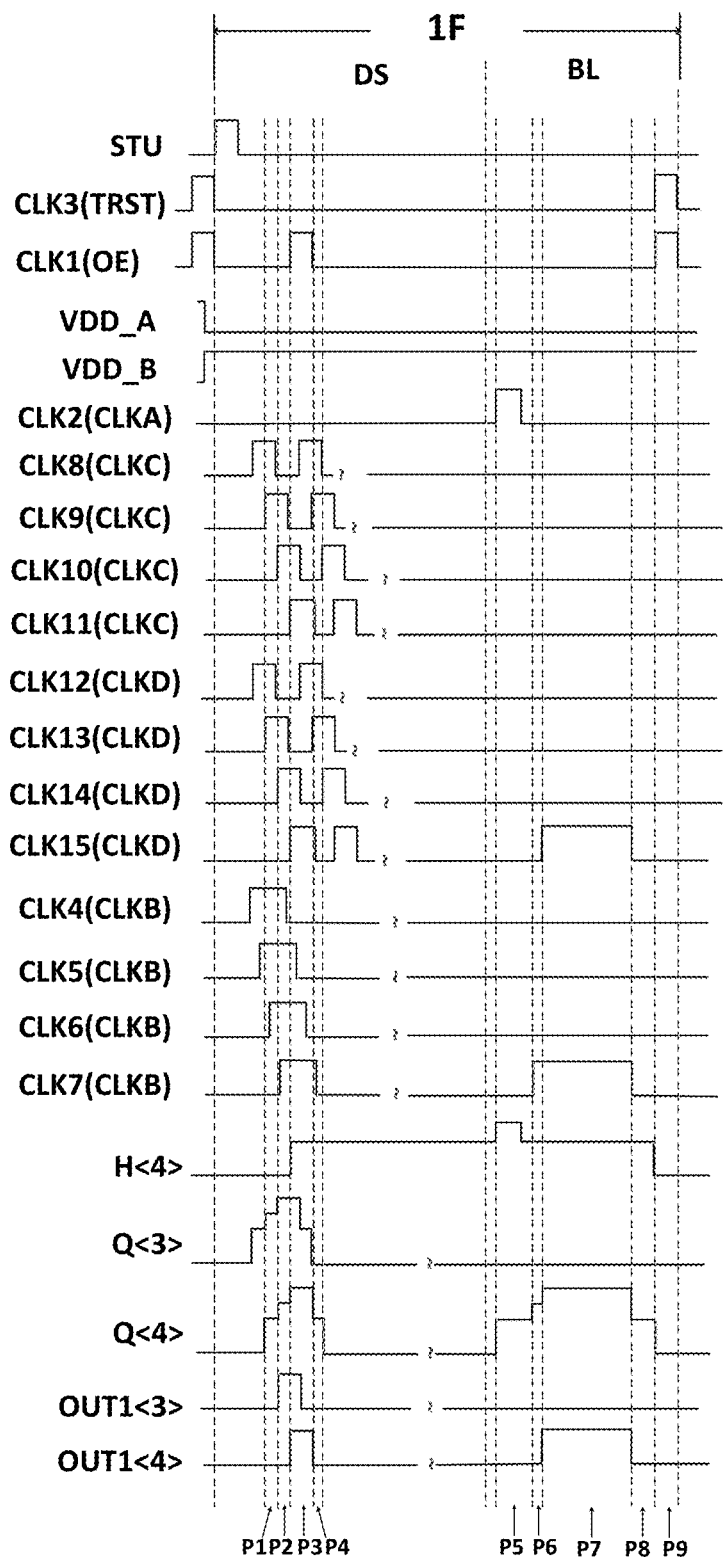
FIG. 9 is a schematic diagram illustrating a timing sequence corresponding to an operation of the gate driver shown in FIG. 8 according to one embodiment of the present disclosure.

FIG. 9 is a schematic diagram illustrating a timing sequence during operation of the gate driver 20 shown in FIG. 8. In FIG. 9, H<4> represents the second node H of the fourth stage of the shift register units in the gate driver 20, Q<3> and Q<4> represent the first node Q of the third and fourth stages of shift register units in the gate driver 20, respectively. OUT1<3> and OUT1<4> represent the first output signal OUT1 of the third and fourth stages of shift register units in the gate driver 20, respectively. Numbers in parentheses represent the number of rows of the sub-pixel units in the corresponding display panel, which is the same in the following embodiments, and a description thereof will not be repeated.

It should be appreciated that, in this embodiment, for example, the shift signal CR output by each stage of the shift register units 10 is the same as the first output signal OUT1 output by each stage of the shift register units 10, therefore, the shift signals output by the third and fourth stages of shift register units are not shown in FIG. 9.

1F represents the first frame, DS represents the display period of one frame, and BL represents the blanking period of one frame. It should be appreciated that, STU in FIG. 8 represents the first input signal received by the first and second stages of shift register units.

In addition, it should be appreciated that, In FIG. 9, the third voltage VDD_A is a low level and the fourth voltage VDD_B is a high level. However, the embodiments of the present disclosure are not limited to this. The signal level in the timing sequence shown in FIG. 9 is only schematic and does not represent a true level.

The operation principle of the gate driver 20 shown in FIG. 8 is illustrated with reference to the timing sequence in FIG. 9. For example, the shift register unit shown in FIG. 4 is adopted in the gate driver 20 shown in FIG. 8.

Before starting a first frame 1F, the third sub-clock signal line CLK3 is provided with a high level. Since each stage of the shift register units is connected with the third sub-clock signal line CLK3 to receive the global reset signal TRST, the sixteenth transistor M16 is turned on due to the high level of the global reset signal TRST, thus the first node Q in each stage of the shift register units may be reset. At the same time, the first sub-clock signal line CLK1 is provided with a high level. Since each stage of the shift register units is connected with the first sub-clock signal line CLK1 to receive the selecting control signal OE, the high level of the selecting control signal OE enables the second transistor M2 to be turned on. Moreover, the second input signal STU2 received by the second transistor M2 is a low level, so the second node H in each stage of the shift register units can be reset by the low level of the input signal STU2. Thus, the global reset of the gate driver 20 is realized.

Since the fourth voltage VDD_B is a high level, the ninth transistor M9 is turned on, so that the third node QB is charged to a high level. The high level of the third node QB enables the eleventh transistor M11 to be turned on, thus further pulling down the level of the first node Q.

In the display period DS of the first frame 1F, an operation procedure of the fourth stage of the shift register units 10 is described as follows.

In a first stage P1, since the fourth stage of the shift register units is connected with the second stage of the shift register units to receive the shift signal CR as the first input signal STU1, and since the shift signal CR (i.e., the third clock signal CLKC provided by the ninth sub-clock signal line CLK9) output by the second stage of the shift register units is a high level, the first input signal STU1 received by the fourth stage of the shift register units in the first stage P1 is a high level. Since the first input signal STU1 is a high level, the fifth transistor M5 is turned on. The first node Q<4> is charged by using the high level of the second voltage VDD, which is corresponding to a first rising edge of the first node Q<4> in the display period DS in FIG. 9.

In a second stage P2, the first node Q<4> remains a high level due to holding effects of the first capacitor C1 and the third capacitor C3, so the first transistor M1 remains an on-state. At the same time, the second clock signal CLKB provided by the seventh sub-clock signal line CLK7 changes from a low level to a high level, so the level of the first node Q<4> is further pulled up by the high level of the second clock signal CLKB through the boosting effect of the first capacitor C1, which is corresponding to a second rising edge of the first node Q<4> in the display period DS in FIG. 9.

In a third stage P3, the first node Q<4> remains the high level due to the holding effects of the first capacitor C1 and the third capacitor C3, so the seventh transistor M7 remains an on-state. At the same time, the fourth clock signal CLKD provided by the fifteenth sub-clock signal line CLK15 becomes a high level, so the first output signal OUT1<4> output by the fourth stage of the shift register units becomes a high level. The level of the first node Q<4> is further pulled up due to a boosting effect of the third capacitor C3, which is corresponding to a third rising edge of the first node Q<4> in the display period DS in FIG. 9.

It should be appreciated that, in the third stage P3, the high level of the first node Q<4> also enables the sixth transistor M6 to be turned on. At the same time, the third clock signal CLKC provided by the eleventh sub-clock signal line CLK11 becomes a high level, so the shift signal CR output by the fourth stage of the shift register units becomes a high level. For example, the shift signal output by the fourth-stage of the shift register units may be provided to the sixth stage of the shift register units as the first input signal STU1 to achieve the row-by-row scanning display; the first output signal OUT1<4> output by the fourth-stage of the shift register units may be used for driving the fourth row of the sub-pixel units in the display panel to display.

In a fourth stage P4, since the fourth clock signal CLKD provided by the fifteenth sub-clock signal line CLK15 becomes a low level, the first output signal OUT1<4> output by the fourth stage of the shift register units becomes a low level. Then the second clock signal CLKB provided by the seventh sub-clock signal line CLK7 changes from a high level to a low level. Due to the boosting effect of the first capacitor C1 and the third capacitor C3, the level of the first node Q<4> may be decreased by a certain magnitude, but still remain a high level.

After the fourth stage P4, since the fourth stage of the shift register units is connected with the seventh stage of the shift register units to receive the shift signal CR as the display reset signal STD, and the shift signal CR (i.e., the third clock signal CLKC provided by the tenth sub-clock signal line CLK10) output by the seventh stage of the shift register units is a high level, the display reset signal STD received by the fourth stage of the shift register units is a high level. Since the display reset signal STD is a high level, the fifteenth transistor M15 is turned on. Therefore, the first node Q<4> can be reset by the low level of the first voltage VGL1, the first node Q<4> becomes a low level.

After the fourth stage of the shift register units driving the fourth row of the sub-pixels in the display panel to display, the fifth stage and the sixth stages of shift register units drive the sub-pixel units in the display panel row by row to complete displaying of one frame. Then the display period DS of the first frame 1F ends.

For example, when the fourth row of the sub-pixel units needs to be compensated in the first frame 1F, the fourth stage of the shift register units is also operated in the display period DS of the first frame 1F as follows.

In the third stage P3, since the selecting control signal OE provided by the first sub-clock signal line CLK1 is a high level, the second transistor M2 is turned on. At the same time, since the shift signal CR output by the fourth stage of the shift register units is a high level, the second input signal STU2 received by the second transistor M2 is a high level. The second node H<4> may be charged by the high level of the second input signal STU2 to pull up the level of the second node H<4>. Due to a holding effect of the second capacitor C2, a high level of the second node H<4> may be maintained to the blanking period BL of the first frame.

For example, when the fourth row of the sub-pixel units needs to be compensated in the first frame 1F, the fourth stage of the shift register units is also operated in the blanking period BL of the first frame 1F as follows.

In a fifth stage P5, the first clock signal CLKA provided by the second sub-clock signal line CLK2 becomes a high level, and the fourth transistor M4 is turned on. At the same time, the third transistor M3 is also turned on under control of the high level of the second node H<4>. Thus, the first node Q<4> may be charged by using the high level of the first clock signal CLKA to pull up the level of the first node Q<4>, which is corresponding to a first rising edge of the first node Q<4> in the blanking period BL in FIG. 9.

In the fifth stage P5, due to a coupling effect of a parasitic capacitance in the third transistor M3, when the first clock signal CLKA provided by the second sub-clock signal line CLK2 changes from a low level to a high level, the level of the second node H<4> may be increased by a small amplitude.

In a sixth stage P6, the first node Q<4> remains the high level due to the holding effects of the first capacitor C1 and the third capacitor C3, so the first transistor M1 remains the on-state. At the same time, the second clock signal CLKB provided by the seventh sub-clock signal line CLK7 changes from the low level to a high level, so the level of the first node Q<4> is further pulled up by the high level of the second clock signal CLKB through the boosting effect of the first capacitor C1, which is corresponding to a second rising edge of the first node Q<4> in the blanking period BL in FIG. 9.

In a seventh stage P7, the fourth clock signal CLKD provided by the fifteenth sub-clock signal line CLK15 becomes a high level, so the first output signal OUT1<4> output by the fourth stage of the shift register units becomes a high level. The level of the first node Q<4> is further pulled up due to the boosting effect of the third capacitor C3, which is corresponding to a third rising edge of the first node Q<4> in the blanking period BL in FIG. 9. For example, the first output signal OUT1<4> output by the fourth shift register unit may be used for driving the fourth row of the sub-pixel units in the display panel to realize the external compensation.

It should be appreciated that, in the seventh stage of P7, the third clock signal CLKC provided by the eleventh sub-clock signal line CLK11 does not need to be a high level because the shift signal CR is not needed.

In an eighth stage P8, since the fourth clock signal CLKD provided by the fifteenth sub-clock signal line CLK15 becomes a low level, the first output signal OUT1<4> output by the fourth stage of the shift register units becomes a low level. Then the second clock signal CLKB provided by the seventh sub-clock signal line CLK7 changes from a high level to a low level. Due to the boosting effect of the first capacitor C1 and the third capacitor C3, the level of the first node Q<4> may be decreased by a certain amplitude, but still remain a high level.

In a ninth stage P9, the global reset signal TRST provided by the third sub-clock signal line CLK3 is a high level, then the sixteenth transistor M16 in each stage shift register is turned on, thus the first node Q in each stage of the shift register units may be reset. At the same time, the first sub-clock signal line CLK1 is provided with a high level. Since each stage of the shift register units is connected with the first sub-clock signal line CLK1 to receive the selecting control signal OE, the high level of the selecting control signal OE enables the second transistor M2 to be turned on. Moreover, the second input signal STU2 received by the second transistor M2 is a low level, so the second node H in each stage of the shift register units can be reset by the low level of the input signal STU2. Thus, the global reset of the gate driver 20 is realized.

Then the driving timing of the first frame ends. The driving procedure of the gate driver in the second frame, the third frame and more frames may refer to the above description, which will not be repeated herein.

In the gate driver 20 of the embodiments of the present disclosure, in the display period DS and the blanking period BL of one frame, after the first input circuit 100 and the second input circuit 500 complete charging the first node Q, the charging enhancement circuit 300 may further enhance the level of the first node Q, thus providing a higher level at the first node Q, avoiding the abnormal output of the output circuit 200, and improving the reliability of the shift register unit 10.

It should be appreciated that, as shown in FIG. 9, in order to make the first node Q<4> at a higher level when the output circuit 200 of the fourth stage of the shift register units outputs the driving signal, a rising edge of the second clock signal CLKB (i.e. the charging enhancement signal CE) provided by the seventh sub-clock signal line CLK7 is earlier than that of the first output signal OUT1<4>. In addition, as shown in FIG. 9, a falling edge of the second clock signal CLKB (i.e. the charging enhancement signal CE) provided by the seventh sub-clock signal line CLK7 is slightly later than that of the first output signal OUT1<4>, which may further ensure that the first node Q<4> is at a higher level when the output circuit 200 of the fourth stage of the shift register units outputs the driving signal. The embodiments of the present disclosure are not limited thereto. For example, the falling edge of the second clock signal CLKB (i.e., the charging enhancement signal CE) provided by the seventh sub-clock signal line CLK7 may also be synchronized with the falling edge of the first output signal OUT1<4>.

It should be appreciated that, in the above description of the operation principle of the random compensation, that the driving signal output corresponding to the fourth row of the sub-pixel units of the display panel in the blanking period of the first frame is taken as an example, which is not limited by the present disclosure. For example, when the driving signal corresponding to the $(n)^{th}$ row of the sub-pixel units of the display panel needs to be output in the blanking period of one frame (n is an integer larger than zero), the following operation may be performed.

For example, in the display period of the frame, when the shift signal CR output by the $n^{th}$ stage of the shift register units is a high level, the received selecting control signal OE is also a high level, thus the level of the second node H of the $n^{th}$ stage of the shift register units is charged to a high level, which high level can be maintained to the blanking period of the frame.

In the blanking period of the frame, the first clock signal CLKA with a high level is provided to pull up the level of the first node Q in the $n^{th}$ stage of the shift register units before the driving signal needs to be output. Then when the driving signal needs to be output, the fourth clock signal CLKD with a high level is provided, and the fourth clock signal CLKD is output, by the circuit 200 which is turned on, as the first output signal OUT1 to the first output signal terminal OP1.

In the gate driver 20 of the embodiments of the present disclosure, the random compensation may also be realized while the row-by-row sequential compensation is accomplished (for example the row-by-row sequential compensation is required in the shutdown detection, which may avoid the poor display problems such as the scanning line and the uneven display brightness caused by the row-by-row sequential compensation.

Figure 10:
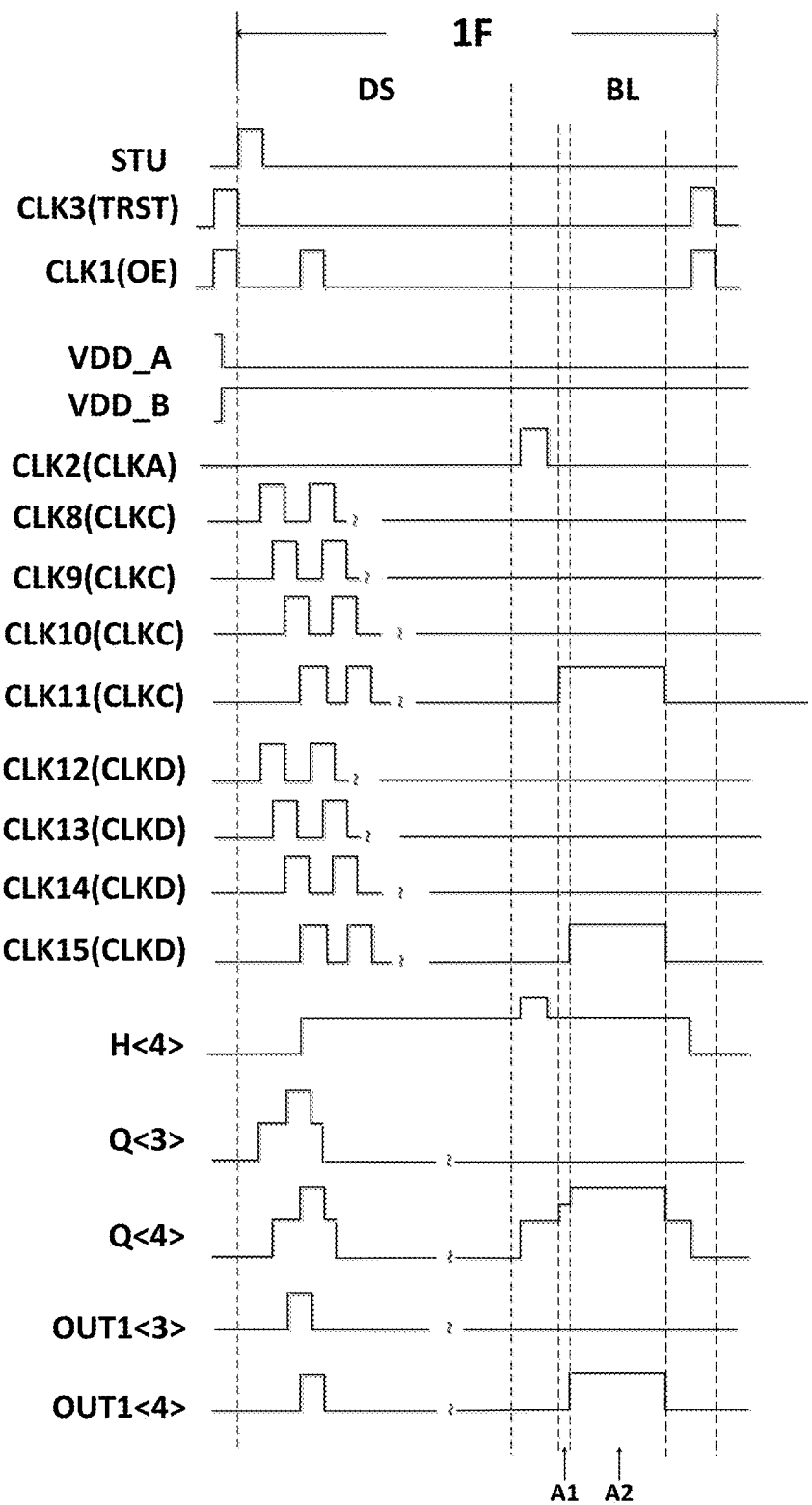
FIG. 10 is a schematic diagram illustrating a timing sequence according to one embodiment of the present disclosure.

In another embodiment, for the gate driver consisted of the shift register units 10 shown in FIG. 5, a corresponding timing sequence is shown in FIG. 10, and only differences compared with FIG. 9 is described below. It should be appreciated that, since the first transistor M1 and the first capacitor C1 are not arranged in the shift register unit 10 shown in FIG. 5, the second clock signal CLKB is no longer shown in FIG. 10 accordingly.

For example, as shown in FIG. 10, in a first stage A1 of the blanking period BL, the third clock signal CLKC provided by the eleventh sub-clock signal line CLK11 becomes a high level, so the level of the first node Q<4> is further pulled up by the high level of the third clock signal CLKC through the boosting effect of the seventh capacitor C7, which is corresponding to a second rising edge of the first node Q<4> in the blanking period BL in FIG. 10.

In a second stage A2, the fourth clock signal CLKD provided by the fifteenth sub-clock signal line CLK15 becomes a high level, so the first output signal OUT1<4> output by the fourth stage of the shift register units becomes a high level. The level of the first node Q<4> is further pulled up due to the boosting effect of the third capacitor C3, which is corresponding to a third rising edge of the first node Q<4> in the blanking period BL in FIG. 10.

As mentioned above, in the shift register unit 10 shown in FIG. 5, by providing the seventh capacitor C7, the level of the first node Q may be further enhanced in the blanking period of one frame, thereby avoiding the abnormal output and improving the reliability of the shift register unit 10.

Figure 11:
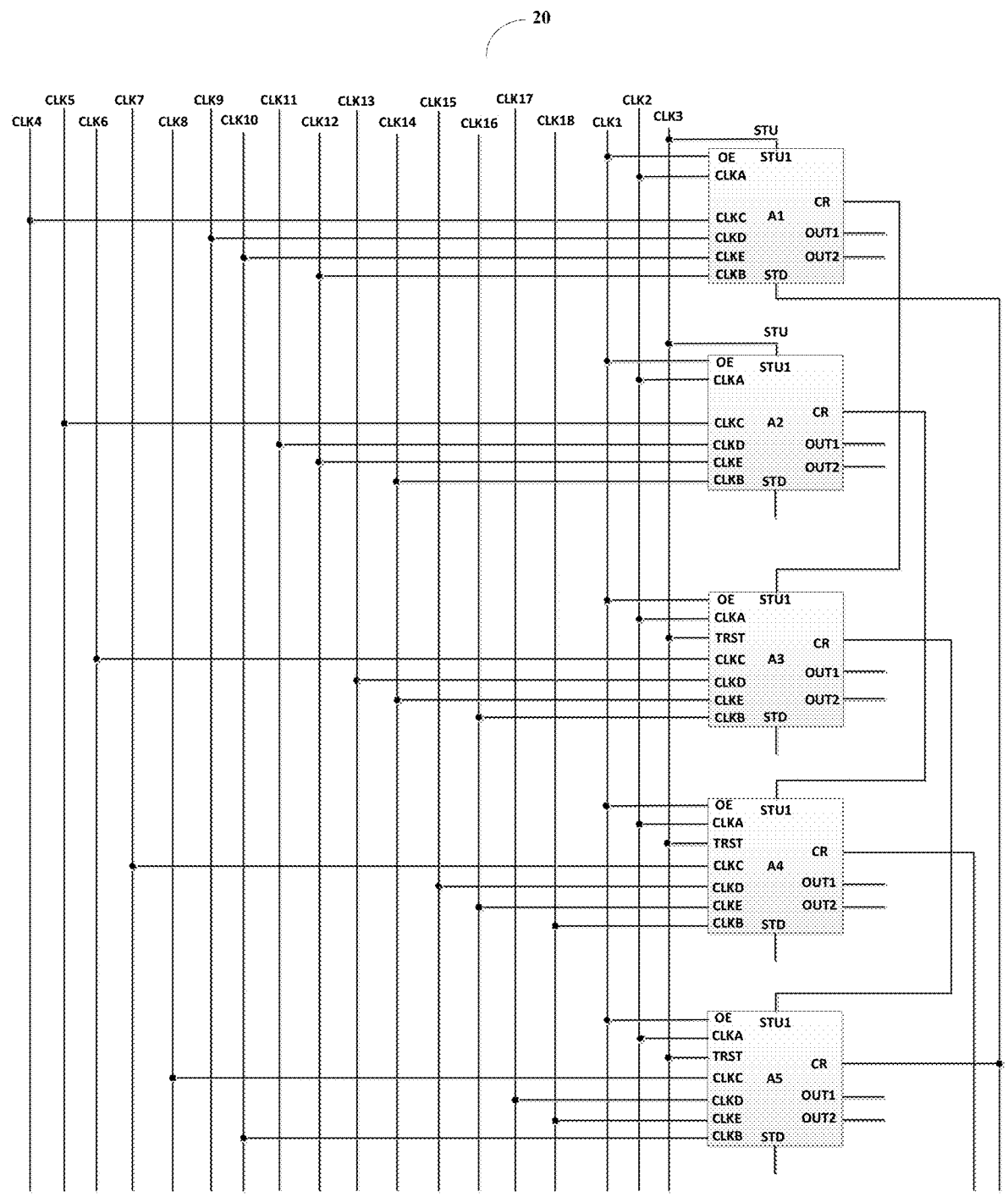
FIG. 11 is a schematic diagram illustrating another gate driver according to one embodiment of the present disclosure.

Some embodiments of the present disclosure further provides a gate driver 20, as shown in FIG. 11, the gate driver 20 includes a plurality of shift register units 10 connected in cascades, the shift register units 10 may have the structure of the shift register unit 10 shown in FIG. 6 or an variant thereof, for example. It should be appreciated that, only the first five stages of shift register units (A1, A2, A3, A4 and A5) of the gate driver 20 are schematically shown in FIG. 11, and the embodiments of the present disclosure are not limited thereto.

For example, as shown in FIG. 11, the first output signal OUT1 and the second output signal OUT2 output by each shift register unit 10 may be used for driving two rows of the sub-pixel units in the display panel. For example, A1, A2, A3, A4 and A5 may be used to drive a first row, a second row, a third row, a fourth row, a fifth row, a sixth row, a seventh row, an eighth row, a ninth row and a tenth row of sub-pixel units in the display panel, respectively.

As shown in FIG. 11, the gate driver 20 further includes a first sub-clock signal line CLK1, a second sub-clock signal line CLK2 and a third sub-clock signal line CLK3.

Each stage of the shift register units is connected with the first sub-clock signal line CLK1 to receive the selecting control signal OE; each stage of the shift register units is connected with the second sub-clock signal line CLK2 to receive the first clock signal CLKA.

The first stage and the second stage of the shift register units are connected with the third sub-clock signal line CLK3 to receive the first input signal STU1, and other stages of shift register units besides the first stage and the second stage of the shift register units are also connected to the third sub-clock signal line CLK3 to receive the global reset signal TRST. Thus, a quantity of clock signal lines may be saved, and a frame size of the display device adopting the gate driver may be reduced. For example, a sixteenth transistor M16 may be not arranged in the second stage of the shift register units 10.

As shown in FIG. 11, the gate driver 20 further includes a fourth sub-clock signal line CLK4, a fifth sub-clock signal line CLK5, a sixth sub-clock signal line CLK6, a seventh sub-clock signal line CLK7 and an eighth sub-clock signal line CLK8.

A $(5n-4)^{th}$ stage of the shift register units is connected with the fourth sub-clock signal line CLK4 to receive the third clock signal CLKC; a $(5n-3)^{th}$ stage of the shift register units is connected with the fifth sub-clock signal line CLK5 to receive the third clock signal CLKC; a $(5n-2)^{th}$ stage of the shift register units is connected with the sixth sub-clock signal line CLK6 to receive the third clock signal CLKC; a $(5n-1)$th stage of the shift register units is connected with the seventh sub-clock signal line CLK7 to receive the third clock signal CLKC; a $(5n)^{th}$ stage of the shift register units is connected with the eighth sub-clock signal line CLK8 to receive the third clock signal CLKC; n is an integer larger than zero. The third clock signal CLKC provided by the fourth through eighth sub-clock signal lines is used for outputting a shift signal CR.

As shown in FIG. 11, the gate driver 20 further includes a ninth sub-clock signal line CLK9, a tenth sub-clock signal line CLK10, an eleventh sub-clock signal line CLK11, a twelfth sub-clock signal line CLK12, a thirteenth sub-clock signal line CLK13, a fourteenth sub-clock signal line CLK14, a fifteenth sub-clock signal line CLK15, a sixteenth sub-clock signal line CLK16, a seventeenth sub-clock signal line CLK17, and an eighteenth sub-clock signal line CLK18.

A $(5n-4)^{th}$ stage of the shift register units is connected with the ninth sub-clock signal line CLK9 to receive the fourth clock signal CLKD; the $(5n-4)^{th}$ stage of the shift register units is connected with the tenth sub-clock signal line CLK10 to receive the fifth clock signal CLKE; the $(5n-4)^{th}$ stage of the shift register units is connected with the twelfth sub-clock signal line CLK12 to receive the second clock signal CLKB (i.e. the charging enhancement signal CE).

A $(5n-3)^{th}$ stage of the shift register units is connected with the eleventh sub-clock signal line CLK11 to receive the fourth clock signal CLKD; the $(5n-3)^{th}$ stage of the shift register units is connected with the twelfth sub-clock signal line CLK12 to receive the fifth clock signal CLKE; the $(5n-3)^{th}$ stage of the shift register units is connected with the fourteenth sub-clock signal line CLK14 to receive the second clock signal CLKB (i.e. the charging enhancement signal CE).

A $(5n-2)^{th}$ stage of the shift register units is connected with the thirteenth sub-clock signal line CLK13 to receive the fourth clock signal CLKD; the $(5n-2)^{th}$ stage of the shift register units is connected with the fourteenth sub-clock signal line CLK14 to receive the fifth clock signal CLKE; the $(5n-2)^{th}$ stage of the shift register units is connected with the sixteenth sub-clock signal line CLK16 to receive the second clock signal CLKB (i.e. the charging enhancement signal CE).

A $(5n-1)^{th}$ stage of the shift register units is connected with the fifteenth sub-clock signal line CLK15 to receive the fourth clock signal CLKD; the $(5n-1)^{th}$ stage of the shift register units is connected with the sixteenth sub-clock signal line CLK16 to receive the fifth clock signal CLKE; the $(5n-1)^{th}$ stage of the shift register units is connected with the eighteenth sub-clock signal line CLK18 to receive the second clock signal CLKB (i.e. the charging enhancement signal CE).

A $(5n)^{th}$ stage of the shift register units is connected with the seventeenth sub-clock signal line CLK17 to receive the fourth clock signal CLKD; the $(5n)^{th}$ stage of the shift register units is connected with the eighteenth sub-clock signal line CLK18 to receive the fifth clock signal CLKE; the $(5n)^{th}$ stage of the shift register units is connected with the tenth sub-clock signal line CLK10 to receive the second clock signal CLKB (i.e. the charging enhancement signal CE).

As mentioned above, in the gate driver 20 shown in FIG. 11, a 10CLK clock signal is adopted, the ninth through eighteenth sub-clock signal lines (CLK9-CLK18), ten clock signal lines in total, are used for providing the respective stages of the shift register units 10 with driving signals output on a per-row basis. A specific timing waveform may be shown in FIG. 12. In this embodiment, a pre-charging time of each row of the sub-pixel units may be further increased by using the 10CLK clock signal, so that the gate driver 20 may be applied to a scanning display at higher frequencies.

In this embodiment, for one stage of the shift register units 10, there is no need of a separate signal line for providing the second clock signal CLKB (i.e. the charging enhancement signal CE), any one signal line from the ninth through eighteenth sub-clock signal lines can be used to provide the second clock signal CLKB. In the case of 10CLK clock signal, a quantity of clock signal lines may be saved by sharing the clock signal lines, and thus a frame size of the display device adopting the gate driver may be reduced.

Figure 12:
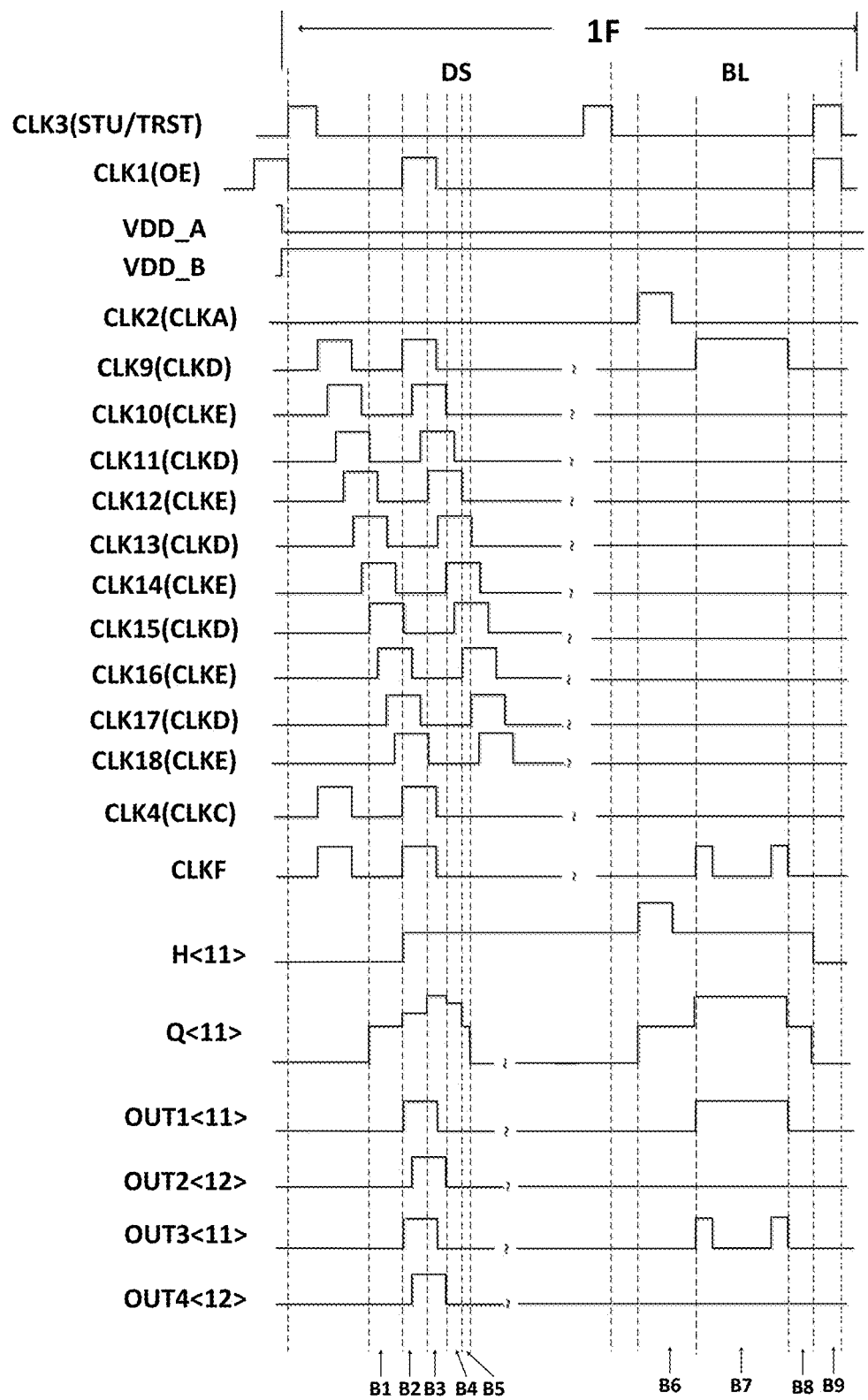
FIG. 12 is a schematic diagram illustrating a timing sequence corresponding to an operation of the gate driver shown in FIG. 11 according to one embodiment of the present disclosure.

FIG. 12 is a schematic diagram illustrating a timing sequence corresponding to an operation of the gate driver shown in FIG. 11. In FIG. 12, H<11> represents the second node H of the sixth stage of the shift register units in the gate driver 20, Q<11> represents the first node Q of the sixth stage of the shift register units in the gate driver 20. OUT1<11> and OUT1<12> represent the first output signal OUT1 and the second output signal OUT2 of the sixth stage of the shift register units in the gate driver 20, respectively.

1F represents the first frame, DS represents the display period of one frame, and BL represents the blanking period of one frame. In addition, it should be appreciated that, In FIG. 12, the third voltage VDD_A is a low level and the fourth voltage VDD_B is a high level. However, the embodiments of the present disclosure are not limited to this. The signal level in the timing sequence shown in FIG. 12 is merely schematic and does not represent a true level.

The operation principle of the gate driver 20 shown in FIG. 11 is illustrated with reference to the timing sequence in FIG. 12.

In a first stage B1, since the sixth stage of the shift register units is connected with the fourth stage of the shift register units to receive the shift signal CR as the first input signal STU1, and since the shift signal CR (i.e., the third clock signal CLKC provided by the fifteenth sub-clock signal line CLK15) output by the fourth stage of the shift register units is a high level, the first input signal STU1 received by the sixth stage of the shift register units in the first stage B1 is a high level. Since the first input signal STU1 is a high level, the fifth transistor M5 is turned on. A first node Q<11> is charged by using the high level of the second voltage VDD, which is corresponding to a first rising edge of the first node Q<11> in the display period DS in FIG. 12.

In a second stage B2, the first node Q<11> remains a high level due to holding effects of the first capacitor C1, the third capacitor C3 and the fourth capacitor C4, so the seventh transistor M7 remains an on-state. At the same time, the fourth clock signal CLKD provided by the ninth sub-clock signal line CLK9 changes from a low level to a high level, so a first output signal OUT1<11> output by the sixth stage of the shift register units becomes a high level and the driving signal is started to be output. The level of the first node Q<11> is further pulled up by the high level of the fourth clock signal CLKD through the boosting effect of the third capacitor C3, which is corresponding to a second rising edge of the first node Q<11> in the display period DS in FIG. 12.

It should be appreciated that, in the second stage B2, the fifth clock signal CLKE provided by the tenth sub-clock signal line CLK10 changes from a low level to a high level, so a second output signal OUT1<12> output by the sixth stage of the shift register units becomes a high level and the driving signal is started to be output. The level of the first node Q<11> may be affected by the high level of the fifth clock signal CLKE due to a boosting effect of the fourth capacitor C4. However, when setting, for example, capacitances of the third capacitor C3 and the fourth capacitor C4 are smaller than that of the first capacitor C1 (for example, the capacitance of the first capacitor C1 is 4 pF, the capacitance values of the third capacitor C3 and the fourth capacitor C4 are 1 pF), so an influence of the fifth clock signal CLKE on the level of the first node Q<11> is ignored herein.

In a third stage B3, the first node Q<11> remains the high level due to the holding effects of the first capacitor C1, the third capacitor C3 and the fourth capacitor C4, so the first transistor M1 remains an on-state. The sixth stage of the shift register units is connected with the twelfth sub-clock signal line CLK12 to receive the second clock signal CLKB (i.e. the charging enhancement signal CE), the charging enhancement signal CE provided by the twelfth sub-clock signal line CLK12 becomes a high level. The level of the first node Q<11> is further pulled up due to the boosting effect of the first capacitor C1, which is corresponding to a third rising edge of the first node Q<11> in the display period DS in FIG. 12.

In the third stage B3, when the fourth clock signal CLKD provided by the ninth sub-clock signal line CLK9 changes from a high level to a low level, the first output signal OUT1<11> output by the sixth stage of the shift register units becomes a low level. However, in this stage, a high level of the first node Q<11> is maintained by the charging enhancement signal CE provided by the twelfth sub-clock signal line CLK12, therefore the level of the first node Q<11> is not affected by a change of the fourth clock signal CLKD on the ninth sub-clock signal line CLK9 from a high level to a low level.

In a fourth stage B4, since the fifth clock signal CLKE provided by the tenth sub-clock signal line CLK10 becomes a low level, the second output signal OUT2<12> output by the sixth stage of the shift register units becomes a low level. Due to the boosting effect of the fourth capacitor C4, the level of the first node Q<11> may be decreased by a certain amplitude, but still remain a high level, which is corresponding to a first falling edge of the first node Q<11> in the display period DS in FIG. 12.

In a fifth stage B5, the charging enhancement signal CE provided by the twelfth sub-clock signal line CLK12 changes from a high level to a low level. Due to the boosting effect of the first capacitor C1, the level of the first node Q<11> may be decreased by a certain amplitude, but still remain a high level, which is corresponding to a second falling edge of the first node Q<11> in the display period DS in FIG. 12.

After the fifth stage B5, since the sixth stage of the shift register units is connected with the tenth stage of the shift register units to receive the shift signal CR as the display reset signal STD, and the shift signal CR (which is the same with the fourth clock signal CLKD provided by the seventeenth sub-clock signal line CLK17) output by the tenth stage of the shift register units is a high level, the display reset signal STD received by the sixth stage of the shift register units is a high level. Since the display reset signal STD is a high level, the fifteenth transistor M15 is turned on. Therefore, the first node Q<11> can be reset by the low level of the first voltage VGL1, the first node Q<11> becomes a low level.

After the sixth stage of the shift register units drives the eleventh row and the twelfth row of the sub-pixels in the display panel to display, in a like manner, the seventh stage and the eighth stage of the shift register units drive the sub-pixel units in the display panel row by row to complete displaying of one frame. Then the display period DS of the first frame 1F ends.

For example, when the eleventh row of the sub-pixel units needs to be compensated in the first frame 1F, the following operations are also performed to the sixth stage of the shift register units in the display period DS of the first frame 1F.

In the second stage B2, since the selecting control signal OE provided by the first sub-clock signal line CLK1 is a high level, the second transistor M2 is turned on. At the same time, since the shift signal CR output by the sixth stage of the shift register units is a high level, the second input signal STU2 received by the second transistor M2 is a high level. A second node H<11> may be charged by the high level of the second input signal STU2 to pull up the level of the second node H<11>. Due to a holding effect of the second capacitor C2, a high level of the second node H<11> may be maintained to the blanking period BL of the first frame 1F.

For example, when the eleventh row of the sub-pixel units needs to be compensated in the first frame 1F, the sixth stage of the shift register units is also operated in the blanking period BL of the first frame 1F as follows.

In a sixth stage B6, the first clock signal CLKA provided by the second sub-clock signal line CLK2 becomes a high level, and the fourth transistor M4 is turned on. At the same time, the third transistor M3 is also turned on under control of the high level of the second node H<11>. Thus, the first node Q<11> may be charged by using the high level of the first clock signal CLKA to pull up the level of the first node Q<11>, which is corresponding to a first rising edge of the first node Q<11> in the blanking period BL in FIG. 12.

In the sixth stage B6, due to a coupling effect of a parasitic capacitance in the third transistor M3, when the first clock signal CLKA provided by the second sub-clock signal line CLK2 changes from a low level to a high level, the level of the second node H<11> may be increased by a small amplitude.

In a seventh stage B7, the fourth clock signal CLKD provided by the ninth sub-clock signal line CLK9 becomes a high level, so the first output signal OUT1<11> output by the sixth stage of the shift register units becomes a high level. The level of the first node Q<11> is further pulled up due to the boosting effect of the third capacitor C3, which is corresponding to a second rising edge of the first node Q<11> in the blanking period BL in FIG. 12. For example, the first output signal OUT1<11> output by the sixth shift register unit may be used for driving the eleventh row of the sub-pixel units in the display panel to realize the external compensation.

In an eighth stage B8, since the fourth clock signal CLKD provided by the ninth sub-clock signal line CLK9 becomes a low level, the first output signal OUT1<11> output by the sixth stage of the shift register units becomes a low level. Due to the boosting effect of the third capacitor C3, the level of the first node Q<11> may be decreased by a certain amplitude, but still remain a high level.

In a ninth stage B9, the global reset signal TRST provided by the third sub-clock signal line CLK3 is a high level, then the sixteenth transistor M16 in each stage shift register is turned on, thus the first node Q in each stage of the shift register units can be reset. At the same time, the first sub-clock signal line CLK1 is provided with a high level. Since each stage of the shift register units is connected with the first sub-clock signal line CLK1 to receive the selecting control signal OE, the high level of the selecting control signal OE enables the second transistor M2 to be turned on. Moreover, the second input signal STU2 received by the second transistor M2 is a low level, so the second node H in each stage of the shift register units can be reset by the low level of the input signal STU2. Thus, the global reset of the gate driver 20 is realized.

Then the driving timing of the first frame ends. The driving procedure of the gate driver in the second frame, the third frame and more frames may refer to the above description, which will not be repeated herein.

By adopting the 10CLK clock signal in the gate driver 20 of the present embodiment, the first output signal OUT1 and the second output signal OUT2 output by each stage of the shift register units 10 are overlapped in 75% of the duration of the high levels. For example, as shown in FIG. 12, in first 75% of the time when the first output signal OUT1<11> is a high level (i.e., the second stage B2), although the driving signal provided to the eleventh row of the sub-pixel units in the display panel is a high level, at this time the driving signal is used to pre-charge the eleventh row of the sub-pixel units, and the eleventh row of the sub-pixel units is not displayed in this period of the time. In last 25% of the time when the first output signal OUT1<11> is a high level (i.e., the second stage B2), the driving signal provided to the eleventh row of the sub-pixel units in the display panel is an effective level, then the eleventh row of the sub-pixel units is displayed, so the driving signal output by the shift register unit is the effective level only in the last 25% of the time when the driving signal output by the shift register unit is a high level (e.g. the high level of OUT1<11> in the third stage B3 in FIG. 12). As shown in FIG. 12, in the third stage B3, by providing the high level of the charging enhancement signal CE, the first node Q is always at a high level when the shift register unit outputs the effective signal, thus improving the reliability.

For example, in other embodiments, the gate driver 20 shown in FIG. 11 may also adopt the shift register unit shown in FIG. 7, i.e. the shift register unit also includes the third output signal terminal OP3 and the fourth output signal terminal OP4, which output the third output signal OUT3<11> and the fourth output signal OUT4<12> respectively. As shown in FIG. 12, in the blanking period BL, the sixth clock signal CLKF provided to the shift register unit may adopt timing sequence waveforms different from the fourth clock signal CLKD provided by the ninth sub-clock signal line CLK9, thus enabling the sixth stage of the shift register units to output different first output signals OUT1<11> and different third output signals OUT3<11> in the seventh stage B7. The gate driver may be used for driving a display panel, for example, each row of the sub-pixel units in the display panel is provided with two gate lines.

Figure 13:
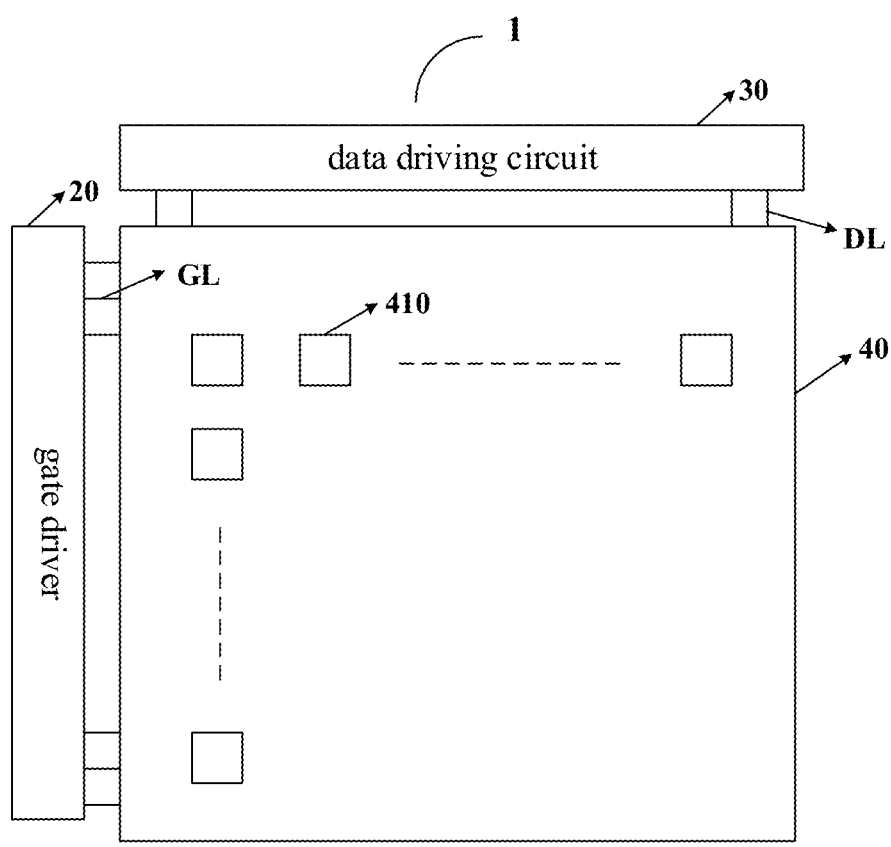
FIG. 13 is a schematic diagram illustrating a display device according to one embodiment of the present disclosure

At least one embodiment of the present disclosure further provides a display device 1, as shown in FIG. 13, the display device 1 includes the gate driver 20 of the embodiments of the present disclosure. The display device 1 further includes a display panel 40 including a plurality of sub-pixel units 410 arranged in array. For example, the display device 1 may further include a data driving circuit 30. The data driving circuit 30 is configured to provide a data signal to a pixel array; the gate driver 20 is configured to provide a driving signal to the pixel array, for example, the driving signal may drive a scanning transistor and a sensing transistor in the sub-pixel unit 410. The data driving circuit 30 is electrically connected with the sub-pixel unit 410 through a data line DL, and the gate driver 20 is electrically connected with the sub-pixel unit 410 through a gate line GL.

It should be appreciated that, the display device 1 in the embodiment may be any product or component with a display function such as a liquid crystal display (LCD) panel, a LCD TV, a display device, an Organic Light-Emitting Diode (OLED) panel, an OLED TV, an electronic paper display device, a mobile phone, a tablet computer, a notebook computer, a digital photo frame, a navigator, etc.

Technical effects of the display device 1 in the embodiments of the present disclosure may refer to corresponding descriptions of the gate driver 20 in the above-mentioned embodiments, which will not be repeated herein.

At least one embodiment of the present disclosure further provides a method for driving the shift register unit 10 in the embodiments of the present disclosure, a plurality of the shift register units 10 are connected in cascades to form the gate driver 20 of one embodiment of the present disclosure, and the gate driver 20 is used to drive a display panel to display at least one frame.

The method includes: charging, by the first input circuit 100, the first node Q in response to the first input signal STU1; enhancing, by the charging enhancement circuit 300, the level of the first node Q in response to the charging enhancement signal CE; and outputting, by the output circuit 200, the shift signal CR and the first output signal OUT1 under control of the level of the first node Q.

For example, in the method of other embodiments of the present disclosure, a rising edge of the charging enhancement signal CE precedes the rising edge of the first output signal OUT1.

For example, in the method of still other embodiments of the present disclosure, a falling edge of the charging enhancement signal CE follows the falling edge of the first output signal OUT1.

For example, in the method of yet still other embodiments of the present disclosure, the rising edge of the charging enhancement signal CE precedes the rising edge of the first output signal OUT1, and the falling edge of the charging enhancement signal CE follows the falling edge of the first output signal OUT1.

It should be appreciated that, detailed descriptions and technical effects of the driving method in the embodiments of the present disclosure may refer to descriptions of operation principles of the shift register unit 10 and the gate driver 20 in the embodiments of the present disclosure, which will not be repeated herein.

The above are merely embodiments of the present disclosure, but a protection scope of the present disclosure is not limited thereto. The protection scope of the present disclosure shall be subject to the protection scope of the claims.

What is claimed is:

1. A shift register unit, comprising a first input circuit, an output circuit, a charging enhancement circuit, a selecting control circuit and a second input circuit;
   wherein the first input circuit is configured to charge a first node in response to a first input signal;
   the output circuit is configured to output, under control of a level of the first node, a shift signal for a row-by-row shift of scanning and a first output signal for driving one row of sub-pixel units in a display panel to perform display scanning;
   the charging enhancement circuit is configured to further enhance the level of the first node in response to a charging enhancement signal;
   the selecting control circuit is configured to charge a second node in response to a selecting control signal and maintain a level of the second node; and
   the second input circuit is configured to charge the first node under control of the level of the second node;
   wherein the second input circuit is connected with the first node and the second node, and the second input circuit is configured to receive a first clock signal and charge the first node by using the first clock signal when the second input circuit is turned on; and
   wherein the second input circuit comprises a third transistor and a fourth transistor;
   a gate of the third transistor is connected with the second node, a first electrode of the third transistor is configured to receive the first clock signal, a second electrode of the third transistor is connected with a first electrode of the fourth transistor; and
   a gate of the fourth transistor is configured to receive the first clock signal, and a second electrode of the fourth transistor is connected with the first node.

2. The shill register unit according to claim 1, wherein the selecting control circuit is connected with the second node, and the selecting control circuit is configured to receive a second input signal and charge the second node by using the second input signal when the selecting control circuit is turned on.

3. The shill register unit according to claim 2, wherein the selecting control circuit comprises a second transistor and a second capacitor; a gate of the second transistor is configured to receive the selecting control signal, a first electrode of the second transistor is configured to receive the second input signal, a second electrode of the second transistor is connected with the second node; and a first electrode of the second capacitor is connected with the second node, and a second electrode of the second capacitor is configured to receive a first voltage.

4. The shift register unit according to claim 1, wherein the output circuit comprises a sixth transistor and a shift signal output sub-circuit, the shift signal output sub-circuit comprises a shift signal output terminal;
   the shift signal output terminal is configured to output the shift signal;
   a gate of the sixth transistor is connected with the first node, a first electrode of the sixth transistor is configured to receive the third clock signal as the shift signal, and a second electrode of the sixth transistor is connected with the shift signal output terminal.

5. The shift register unit according to any claim 1, wherein the charging enhancement circuit comprises a seventh capacitor;
   a first electrode of the seventh capacitor is connected with the first node, a second electrode of the seventh capacitor is connected with a terminal of the output circuit which outputs the shift signal.

6. The shift register unit according to claim 4, wherein the shift signal output terminal is further configured to output the first output signal, and the third clock signal received by the first electrode of the sixth transistor is used as the first output signal.

7. The shift register unit according to claim 4, wherein the output circuit further comprises a first output sub-circuit, the first output sub-circuit comprises a seventh transistor, a third capacitor and a first output signal terminal;
   the first output signal terminal is configured to output the first output signal;
   a gate of the seventh transistor is connected with the first node, a first electrode of the seventh transistor is configured to receive a fourth clock signal as the first output signal, and a second electrode of the seventh transistor is connected with the first output signal terminal; and
   a first electrode of the third capacitor is connected with the first node, and a second electrode of the third capacitor is connected with the first output signal terminal.

8. The shift register unit according to any claim 7, wherein the output circuit further comprises
   a second output sub-circuit, the second output sub-circuit comprises a seventeenth transistor, a fourth capacitor and a second output signal terminal;
   the second output signal terminal is configured to output the second output signal;
   a gate of the seventeenth transistor is connected with the first node, a first electrode of the seventeenth transistor is configured to receive a fifth clock signal and a second electrode of the seventeenth transistor is connected with the second output signal terminal; and
   a first electrode of the fourth capacitor is connected with the first node, and a second electrode of the fourth capacitor is connected with the second output signal terminal.

9. The shift register unit according to claim 8, wherein the output circuit further comprises a third output sub-circuit and a fourth output sub-circuit, the third output sub-circuit comprises a nineteenth transistor, a fifth capacitor and a third output signal terminal;
- the third output signal terminal is configured to output the third output signal;
- a gate of the nineteenth transistor is connected with the first node, a first electrode of the nineteenth transistor is configured to receive a sixth clock signal, and a second electrode of the nineteenth transistor is connected with the third output signal terminal;
- a first electrode of the fifth capacitor is connected with the first node, and a second electrode of the fifth capacitor is connected with the third output signal terminal; and
- the fourth output sub-circuit comprises a twenty-first transistor, a sixth capacitor and a fourth output signal terminal;
- the fourth output signal terminal is configured to output the fourth output signal;
- a gate of the twenty-first transistor is connected with the first node, a first electrode of the twenty-first transistor is configured to receive a seventh clock signal, and a second electrode of the twenty-first transistor is connected with the fourth output signal terminal;
- a first electrode of the sixth capacitor is connected with the first node, and a second electrode of the sixth capacitor is connected with the fourth output signal terminal.

10. A gate driver, comprising a plurality of the shift register units according to claim 1 connected in cascade.

11. The gate driver according to claim 10, further comprising a first sub-clock signal line and a second sub-clock signal line; wherein
- each stage of the shift register units is connected with the first sub-clock signal line to receive a selecting control signal;
- each stage of the shift register units is connected with the second sub-clock signal line to receive a first clock signal;
- a $(n+2)^{th}$ stage of the shift register units is connected with a $n^{th}$ stage of the shift register units to receive a shift signal output by the $n^{th}$ stage of the shift register units as the first input signal of the $(n+2)^{th}$ stage of the shift register units;
- the $n^{th}$ stage of the shift register units is connected with a $(n+3)^{th}$ stage of the shift register units to receive the shift signal output by the $(n+3)^{th}$ stage of the shift register units as a display reset signal of the $n^{th}$ stage of the shift register units;
- the shift signal output by each stage of the shift register units is adopted as a second input signal of the current stage of the shift register units;
- n is an integer larger than zero.

12. A display device, comprising the gate driver according to claim 10.

13. The display device according to claim 12, further comprising a plurality of sub-pixel unit arranged in array; wherein
- when the shift register unit outputs the first output signal and a second output signal, the first output signal and the second output signal are respectively provided to sub-pixel units in different rows.

14. A method for driving the shift register unit according to claim 1, comprising:
- charging, by the first input circuit, the first node in response to the first input signal;
- enhancing, by the charging enhancement circuit, the level of the first node in response to the charging enhancement signal; and
- outputting, by the output circuit, the shift signal and the first output signal under control of the level of the first node
- wherein a rising edge of the charging enhancement signal precedes a rising edge of the first output signal; and/or
- a falling edge of the charging enhancement signal follows a falling edge of the first output signal.

15. The shift register unit according to claim 1, wherein the charging enhancement circuit is connected with the first node, and the charging enhancement circuit is configured to receive a second clock signal as the charging enhancement signal, and further enhance the level of the first node by using the second clock signal when the charging enhancement circuit is turned on.

16. The shift register unit according to claim 15, wherein the charging enhancement circuit comprises a first transistor and a first capacitor;
- a gate of the first transistor is connected with the first node, a first electrode of the first transistor is configured to receive the second clock signal, a second electrode of the first transistor is connected with a first electrode of the first capacitor, and a second electrode of the first capacitor is connected with the first node.

17. The shift register unit according to claim 16, further comprising a reset transistor, wherein a gate of the reset transistor is connected with a third node, a first electrode of the reset transistor is connected with the first electrode of the first capacitor, and a second electrode of the reset transistor is configured to receive a first voltage, such that the first capacitor is reset by the first voltage.

* * * * *